United States Patent
Redaelli et al.

(10) Patent No.: US 11,404,637 B2
(45) Date of Patent: Aug. 2, 2022

(54) TAPERED CELL PROFILE AND FABRICATION

(71) Applicant: Micron Technology, inc., Boise, ID (US)

(72) Inventors: Andrea Redaelli, Casatenovo (IT); Anna Maria Conti, Milan (IT); Agostino Pirovano, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/088,253

(22) Filed: Nov. 3, 2020

(65) Prior Publication Data

US 2021/0119123 A1    Apr. 22, 2021

Related U.S. Application Data

(60) Continuation of application No. 16/877,154, filed on May 18, 2020, now Pat. No. 10,847,719, which is a
(Continued)

(51) Int. Cl.
*H01L 45/00* (2006.01)
*H01L 27/24* (2006.01)
*G11C 13/00* (2006.01)

(52) U.S. Cl.
CPC ...... *H01L 45/1233* (2013.01); *G11C 13/0004* (2013.01); *H01L 27/2481* (2013.01); *H01L 45/08* (2013.01); *H01L 45/122* (2013.01); *H01L 45/1266* (2013.01); *H01L 45/143* (2013.01); *H01L 45/144* (2013.01); *H01L 45/1608* (2013.01); *G11C 13/004* (2013.01);
(Continued)

(58) Field of Classification Search
CPC .................................................. H01L 45/1233
See application file for complete search history.

(56) References Cited

U.S. PATENT DOCUMENTS 7,049,652 B2    5/2006    Mokhlesi et al.
7,189,631 B2    3/2007    Yamazaki et al.
(Continued)

FOREIGN PATENT DOCUMENTS

JP    2008198979 A    8/2008
JP    2009130138 A    6/2009
(Continued)

OTHER PUBLICATIONS

Japan Patent Office, "Notice of Rejection Ground," issued in connection with Japanese Patent Application No. 2020-542746, dated Sep. 21, 2021 (6 pages).
(Continued)

*Primary Examiner* — Mounir S Amer
(74) *Attorney, Agent, or Firm* — Holland & Hart LLP

(57) ABSTRACT

Methods, systems, and devices for a tapered cell profile and fabrication are described. A memory storage component may contain multiple chalcogenide materials and may include a tapered profile. For example, a first chalcogenide material may be coupled with a second chalcogenide material. Each of the chalcogenide materials may be further coupled with a conductive material (e.g., an electrode). Through an etching process, the chalcogenide materials may tapered (e.g., step tapered). A pulse may be applied to the tapered chalcogenide materials resulting in a memory storage component that includes a mixture of the chalcogenide materials.

20 Claims, 12 Drawing Sheets

Related U.S. Application Data division of application No. 15/893,100, filed on Feb. 9, 2018, now Pat. No. 10,693,065.

(52) U.S. Cl.
CPC .... *G11C 13/0069* (2013.01); *G11C 2013/005* (2013.01); *G11C 2013/0092* (2013.01); *G11C 2213/52* (2013.01); *G11C 2213/71* (2013.01); *G11C 2213/73* (2013.01); *G11C 2213/77* (2013.01)

(56) References Cited

U.S. PATENT DOCUMENTS

| | | |
|---|---|---|
| 7,547,612 B2 | 6/2009 | Yamazaki et al. |
| 7,550,313 B2 | 6/2009 | Arnold et al. |
| 7,923,348 B2 | 4/2011 | Yamazaki et al. |
| 8,153,488 B2 | 4/2012 | Nishitani et al. |
| 8,179,713 B2 | 5/2012 | Kanzawa et al. |
| 8,222,677 B2 | 7/2012 | Baba et al. |
| 8,502,343 B1 | 8/2013 | Jha et al. |
| 8,625,325 B2 | 1/2014 | An et al. |
| 8,847,186 B2 | 9/2014 | Redaelli et al. |
| 9,257,431 B2 | 2/2016 | Ravasio et al. |
| 9,337,422 B2 | 5/2016 | Cheong et al. |
| 9,640,588 B2 | 5/2017 | Sciarrillo et al. |
| 9,799,381 B1 | 10/2017 | Tortorelli et al. |
| 10,096,576 B1 | 10/2018 | Kinsley |
| 10,424,374 B2 | 9/2019 | Redaelli et al. |
| 10,424,730 B2 | 9/2019 | Pirovano et al. |
| 10,854,813 B2 | 12/2020 | Tortorelli et al. |
| 10,868,248 B2 | 12/2020 | Pirovano et al. |
| 2005/0254291 A1 | 11/2005 | Happ et al. |
| 2006/0157683 A1 | 7/2006 | Scheuerlein |
| 2007/0010082 A1 | 1/2007 | Pinnow et al. |
| 2007/0063180 A1 | 3/2007 | Asano et al. |
| 2007/0097739 A1 | 5/2007 | Happ et al. |
| 2007/0125953 A1 | 6/2007 | Miyake et al. |
| 2007/0238225 A1 | 10/2007 | Wicker |
| 2007/0246782 A1 | 10/2007 | Philipp et al. |
| 2008/0019170 A1 | 1/2008 | Happ et al. |
| 2008/0044632 A1 | 2/2008 | Liu et al. |
| 2008/0246014 A1 | 10/2008 | Lung |
| 2009/0020739 A1 | 1/2009 | Arnold et al. |
| 2009/0134431 A1 | 5/2009 | Tabata et al. |
| 2009/0275196 A1 | 11/2009 | Yamazaki et al. |
| 2010/0032725 A1 | 2/2010 | Baba et al. |
| 2010/0044664 A1 | 2/2010 | Liu |
| 2010/0243980 A1 | 9/2010 | Fukumizu |
| 2010/0328996 A1 | 12/2010 | Shih et al. |
| 2011/0032753 A1 | 2/2011 | An et al. |
| 2011/0155984 A1 | 6/2011 | Redaelli et al. |
| 2012/0069645 A1 | 3/2012 | Goux et al. |
| 2012/0193595 A1 | 8/2012 | Cheng et al. |
| 2012/0282752 A1 | 11/2012 | Lee et al. |
| 2014/0034892 A1 | 2/2014 | Erbetta et al. |
| 2014/0256110 A1 | 9/2014 | Lung et al. |
| 2014/0319442 A1 | 10/2014 | Hayashi |
| 2015/0028280 A1 | 1/2015 | Sciarrillo et al. |
| 2015/0090952 A1 | 4/2015 | Huang |
| 2015/0200368 A1 | 7/2015 | Lee et al. |
| 2015/0255507 A1 | 9/2015 | Pakala et al. |
| 2015/0364681 A1 | 12/2015 | Murase et al. |
| 2015/0372227 A1 | 12/2015 | Liu |
| 2016/0020389 A1 | 1/2016 | Ratnam et al. |
| 2017/0040533 A1 | 2/2017 | Marsh et al. |
| 2017/0069378 A1 | 3/2017 | Shifren et al. |
| 2017/0117467 A1 | 4/2017 | Chang et al. |
| 2017/0125097 A1 | 5/2017 | Tortorelli et al. |
| 2017/0207387 A1 | 7/2017 | Yang et al. |
| 2017/0271581 A1 | 9/2017 | Seong et al. |
| 2017/0346003 A1 | 11/2017 | Liu |
| 2019/0058109 A1 | 2/2019 | Chen et al. |
| 2019/0096461 A1 | 3/2019 | Koike et al. |
| 2019/0252605 A1 | 8/2019 | Redaelli et al. |

FOREIGN PATENT DOCUMENTS

| | | |
|---|---|---|
| JP | 2009218259 A | 9/2009 |
| JP | 2010186872 A | 8/2010 |
| JP | 2010232214 A | 10/2010 |
| JP | 2011139057 A | 7/2011 |
| JP | 2012160710 A | 8/2012 |
| JP | 2013016530 A | 1/2013 |
| JP | 2013130138 A | 7/2013 |
| JP | 2014528656 A | 10/2014 |
| JP | 2016015477 A | 1/2016 |
| JP | 2017510983 A | 4/2017 |
| KR | 20070103699 A | 10/2007 |
| KR | 20090077232 A | 7/2009 |
| KR | 20110033956 A | 4/2011 |
| KR | 20150085155 A | 7/2015 |
| TW | 200409367 A | 6/2004 |
| TW | 200414521 A | 8/2004 |
| TW | 200417033 A | 9/2004 |
| TW | 200805632 A | 1/2008 |
| TW | 200820469 A | 5/2008 |
| TW | 200822294 A | 5/2008 |
| TW | 200908288 A | 2/2009 |
| TW | 201222827 A | 6/2012 |
| TW | 201440178 A | 10/2014 |
| TW | 201503287 A | 1/2015 |
| TW | 201735040 A | 10/2017 |
| WO | 2012/114744 A1 | 8/2012 |
| WO | 2015013478 A1 | 1/2015 |
| WO | 2018200312 A1 | 11/2018 |

OTHER PUBLICATIONS

European Patent Office, "Extended Search Report," issued in connection with European Patent Application No. 19751003.5, dated Sep. 24, 2021 (10 pages).

Lee, F.M., et al., "A Novel Cross Point One-Resistor (0T1R) Conductive Bridge Random Access Memory (CBRAM) with Ultra LowSet/Reset Operation Current," IEEE Symposium on VLSI Technology, Jun. 12-14, 2012, Honolulu, HI, USA, 2012 (pp. 67-68).

Chen, Yi-Chou, et al., "An Access-Transistor-Free (0T/1R) Non-Volatile Resistance Random Access Memory (RRRAM) Using a Novel Threshold Switching, Self-Rectifying Chalcogenide Device," IEEE International Electron Devices Mtg, Dec. 8-10, 2003 (4 pages).

European Patent Office, "Extended Search Report," issued in connection with European Patent Application No. 19752050.5, dated Oct. 7, 2021 (7 pages).

Japan Patent Office, "Office Action," issued in connection with Japanese Patent Application No. 2020-541947, dated Aug. 17, 2021 (37 pgs.).

Japanese Patent Office, "Decision to Grant a Patent," issued in connection with Japanese Patent Application No. 2019-557593, dated Jun. 22, 2021 (5 pages with translation).

IPO, "Office Action," issued in connection with ROC (Taiwan) Patent Application No. 108103433, dated Jun. 25, 2021 (5 pages).

China National Intellectual Property Administration, "First Office Action," issued in connection with Chinese Application No. 201980011249.3, dated Mar. 22, 2021 (16 pages with translation).

European Patent Office, "Extended Search Report," issued in connection with European Patent Application No. 19751568.7, dated May 7, 2021 (6 pages).

Burr, Geoffrey W. et al., "Access devices for 3D crosspoint memory," Journal of Vacuum Science & Technology: Microelectronics and Nanometer Structures, American Institute of Physics, vol. 32, No. 4, Jul. 24, 2014, Melville, NY (23 pages).

Luo, Qing, et al., "Demonstration of 3D Vertical RRAM with Ultra Low-leakage, High-selectivity and Self-compliance memory cells," 2015 IEEE International Electron Devices Meeting, Dec. 7, 2015 (4 pages).

Shenoy, Rohit S., et al., "MIEC (mixed-ionic-electrnoic-conduction)-based access devices for non-volatile crossbar memory arrays," Semiconductor Science Tehnology, IP Publishing Ltd., vol. 29, No. 10, Sep. 18, 2014 (11 pages).

(56) References Cited

OTHER PUBLICATIONS

European Patent Office, "Search Report," issued in connection with European Patent Application No. 18790479.2, dated Nov. 27, 2020 (10 pages).
Intellectual Property Office of Singapore, "Written Opinion," issued in connection with Patent Application No. 11201909850P, dated Sep. 25, 2020 (10 pages).
IPO, "Office Action," issued in connection with ROC (Taiwan) Patent Application No. 107114369, dated Apr. 19, 2019 (9 pages).
IPO, "Office Action," issued in connection with ROC (Taiwan) Patent Application No. 108103433, dated Oct. 17, 2019 (6 pages).
ISA/KR, International Search Report and Written Opinion of the International Searching Authority, Int'l. Appl. No. PCT/US2019/015671, May 14, 2019, Korean Intellectual Property Office, Seo-gu, Daejeon, Republic of Korea, 15 pgs.
ISA/KR, International Search Report and Written Opinion of the International Searching Authority, Int'l. Appl. No. PCT/US2019/015678, May 15, 2019, Korean Intellectual Property Office, Seo-gu, Daejeon, Republic of Korea, 15 pgs.
ISA/KR, International Search Report and Written Opinion of the International Searching Authority, Int'l. Appl. No. PCT/US2019/015683, May 15, 2019, Korean Intellectual Property Office, Seo-gu, Daejeon, Republic of Korea, 13 pgs.
ISA/KR, International Search Report of the International Searching Authority, Int'l. Appl. No. PCT/US2018/028391, Aug. 9, 2018, Korean Intellectual Property Office, Seo-gu, Daejeon, Republic of Korea, 14pgs.
Japan Patent Office, "Notice of Rejection Ground," issued in connection with Japanese Patent Application No. 2019-557593, dated Dec. 15, 2020 (9 pages).
Korean Intellectual Property Office, "Notice of Reasons for Rejection," issued in connection with Korean Patent Application No. 10-2019-7033436, dated Sep. 22, 2020 (7 pages).
U.S. Appl. No. 15/582,329, filed Apr. 28, 2017.
U.S. Appl. No. 15/621,939, filed Nov. 4, 2015.
Korean Intellectual Property Office, "Notice of Reasons for Rejection," issued in connection with Korean Patent Application No. 10-2020-7025924, dated Dec. 31, 2021 (4 pages).
Korean Intellectual Property Office, "Notice of Reasons for Rejection," issued in connection with Korean Patent Application No. 10-2020-7025199, dated Dec. 30, 2021 (7 pages).
Taiwanese Patent Office, "Office Action," issued in connection with Taiwanese Patent Application No. 110138323 dated Apr. 6, 2022 (4 pages).
Japan Patent Office, "Decision to Grant a Patent", issued in connection with Japan Patent Application No. 2020-542746 dated May 10, 2022 (5 pages).

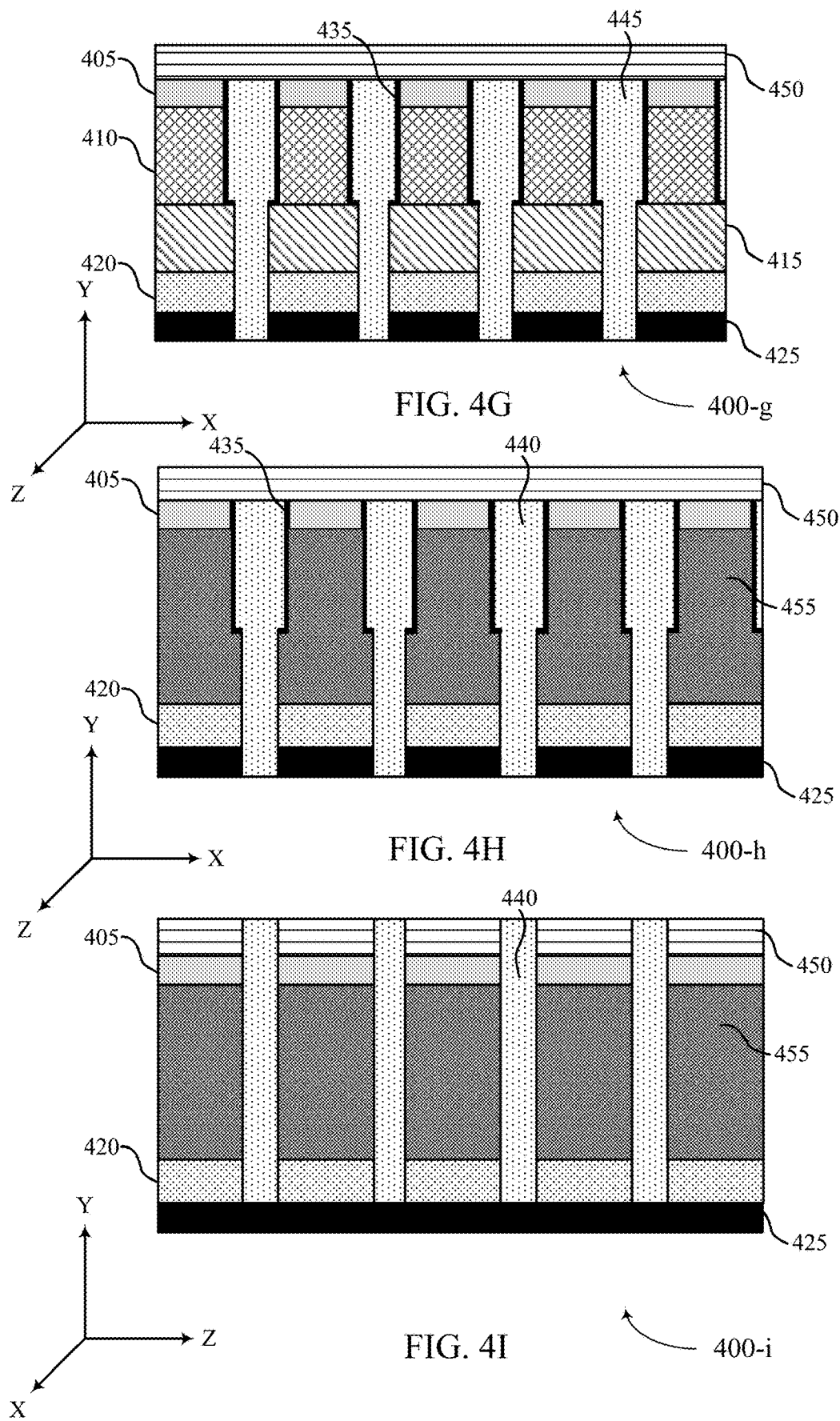

TAPERED CELL PROFILE AND FABRICATION

CROSS REFERENCE

The present application for patent is a continuation of U.S. patent application Ser. No. 16/877,154 by Redaelli et al., entitled "A TAPERED CELL PROFILE AND FABRICATION", filed May 18, 2020, which is a divisional of U.S. patent application Ser. No. 15/893,100 by Redaelli et al., entitled "A TAPERED CELL PROFILE AND FABRICATION", filed Feb. 9, 2018, assigned to the assignee hereof and each of which is expressly incorporated by reference in its entirety herein.

BACKGROUND

The following relates generally to forming a storage component and more specifically to a tapered cell profile and fabrication.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. Some types of memory devices may use variations in resistance or voltage drop across a cell to program and sense different logic states. The manner in which a cell is fabricated may affect the distribution of various materials that compose the cell. Small variations in threshold voltages between different logic states may therefore affect the accuracy with which cells may be read.

BRIEF DESCRIPTION OF THE DRAWINGS

FIGS. 4A through 4I illustrate an example method of forming a memory array that supports a tapered cell profile and fabrication in accordance with examples of the present disclosure.

DETAILED DESCRIPTION

Figure 1:
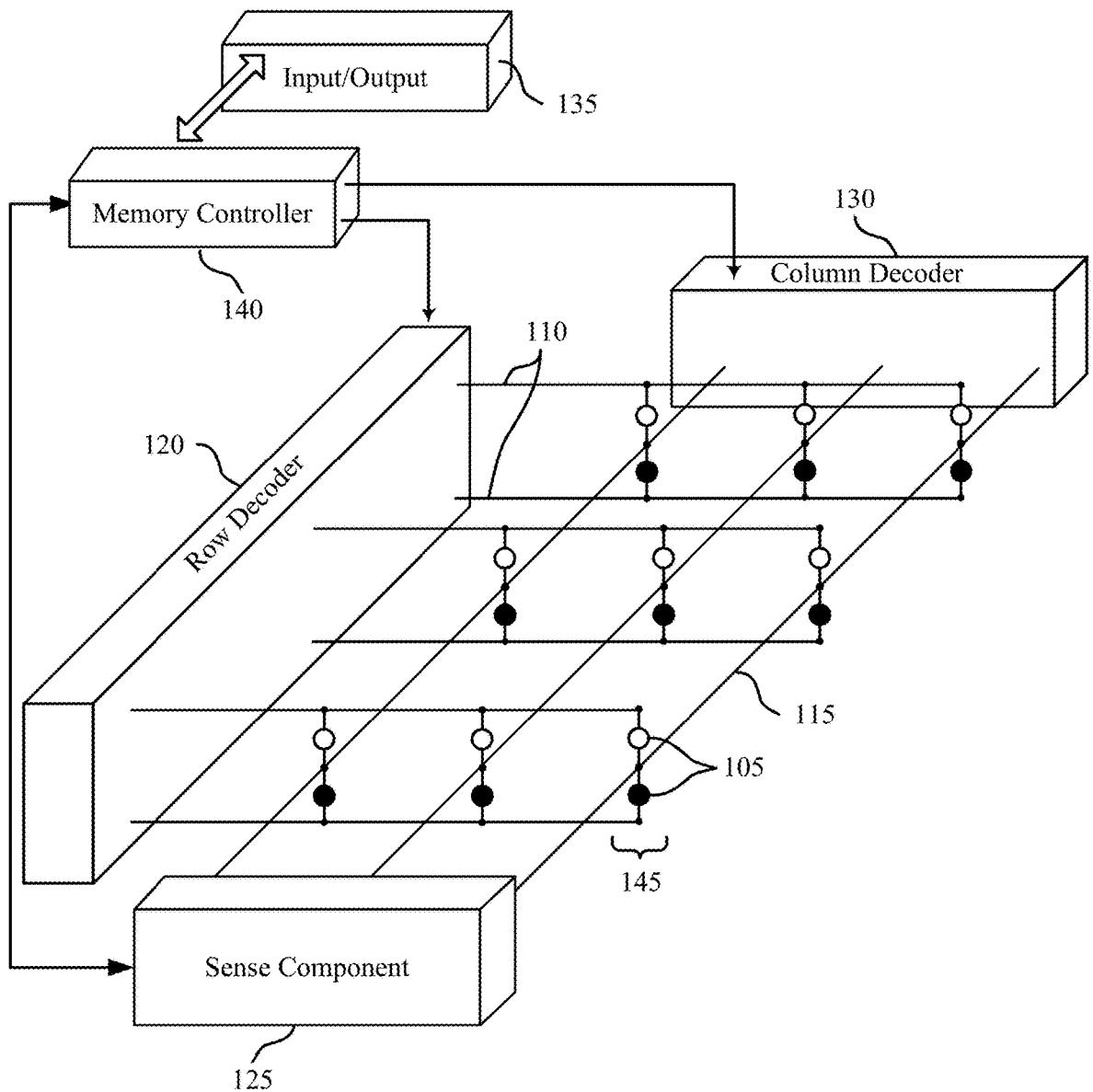
FIG. 1 illustrates an example of a memory array that supports a tapered cell profile and fabrication in accordance with examples of the present disclosure.

A self-selecting memory (SSM) storage component with a tapered geometry may enhance differences in a threshold voltage of the memory cell between different programmed states. These differences may be due to ion crowding at or near a particular electrode of a cell in some cases. This in turn may enhance the sensing window for the cell, which may result in more accurate sensing compared to cells with a non-tapered geometry.

When an SSM cell is programed, the elements within the storage element may separate and ions may migrate toward a particular electrode (e.g., a top electrode or bottom electrode), given the particular cell's polarity. The memory cell may then be read by applying a voltage across the cell to sense how the ions have migrated relative to an electrode. By including multiple materials within the cell (e.g., the cell's composition), increased sensing reliability may be realized in an SSM cell having a tapered geometry. Each storage component may be configured such that, when programmed, ions within the cell migrate toward one electrode. Due to the tapered geometry and composition of the memory cell, a greater density of ions may build up at or near at least one electrode. This may create a region with a high density of ion migration and a region with a low density of ion migration within the cell. Depending on the polarity of the memory cell, this concentration of migrating ions may represent a logic "1" or logic "0" state.

In other examples, a memory storage component as described above may be formed. The storage component may be formed by first depositing a three-dimensional stack of materials, which may include at least a first conductive material, a second conductive material, a first chalcogenide material, and a second chalcogenide material. The materials may be deposited (e.g., layered) such that the second conductive material is located on a first side (e.g., the bottom) of the stack, followed by the first and second chalcogenide materials, respectively, and the first conductive material located on a second side (e.g., the top) of the stack. A first material removal process (e.g., etching) may then occur, resulting in a plurality of lines formed in each of the materials. In some examples, the first removal process may include removing a portion of the first conductive material and the first chalcogenide material, followed by depositing a liner. The liner may be in contact with each of the first conductive and first chalcogenide materials, as well as a portion of the second chalcogenide material. A portion of the second chalcogenide material and the second conductive material may subsequently be removed (e.g., etched), based in part on the presence of the liner, resulting in the first and second chalcogenide materials having a tapered profile.

After forming the taper-shaped chalcogenide materials, a second material removal process (e.g., etching) may then occur—resulting in a plurality of pillars. The plurality of pillars may be formed in the first conductive material, the first chalcogenide material, and the second chalcogenide material. A programming pulse may be applied to the chalcogenide materials to form a storage component that may, in some examples, contain a mixture of the first chalcogenide material and the second chalcogenide material. Such a storage component may enhance the sensing window for the cell, which may result in more accurate sensing as compared to cells with a non-tapered geometry.

Further features of the disclosure broadly introduced above are described below in the context of memory arrays that support a tapered cell profile and fabrication. These and other features of the disclosure are further-illustrated by and described with reference to apparatus diagrams, system diagrams, method-of-formation diagrams, and flowcharts that relate to a tapered cell profile and fabrication.

FIG. 1 illustrates an example memory array 100 that supports a tapered cell profile and fabrication in accordance with various examples of the present disclosure. Memory array 100 may also be referred to as an electronic memory apparatus. Memory array 100 includes memory cells 105 that are programmable to store different states. Each memory cell 105 may be programmable to store two states, denoted a logic "0" and a logic "1." In some cases, memory cell 105 is configured to store more than two logic states.

A memory cell 105 may include a storage component that includes multiple chalcogenide materials. In some examples, the memory storage component may have a variable and configurable threshold voltage or electrical resistance, or both, that is representative of one or more logic states (e.g., logic "1" or "0"). In some examples, a threshold voltage of the storage component may differ depending on a polarity used to program the memory cell 105. For example, an SSM cell programmed with one polarity may have certain resistive properties and thus one threshold voltage. And that SSM cell may be programmed with a different polarity that may result in different resistive properties of the cell and thus a different threshold voltage.

As discussed above, memory storage component may include multiple chalcogenide materials. For example, storage component may include a first chalcogenide material and a second chalcogenide material that is different from the first chalcogenide material. Accordingly, when the storage component is programmed (e.g. at least one pulse is applied to the storage component), a mixture of the first chalcogenide material and the second chalcogenide material may be created. In the programmed cell, individual elements may separate, causing ion migration. The ions may migrate toward a particular electrode, depending on the given cell's polarity. The storage component may then be read by applying a voltage across the cell 105 to sense which electrode ions have migrated toward. In some examples, cations may migrate towards one of the electrodes while anions may migrate towards the other of the electrodes.

In some examples, cell programming may exploit the crystalline structure or atomic configuration to achieve different logic states. For example, a material with a crystalline or an amorphous atomic configuration may have different electrical resistances. A crystalline state may have a low electrical resistance and may, in some cases, be referred to as the "set" state. An amorphous state may have a high electrical resistance and may be referred to as the "reset" state. A voltage applied to the memory cell 105 may thus result in different currents depending on whether the material is in a crystalline or an amorphous state, and the magnitude of the resulting current may be used to determine the logic state stored by memory cell 105.

In some cases, a material in the amorphous, or reset, state may have a threshold voltage associated with it—that is, current flows after the threshold voltage is exceed. Thus, if the applied voltage is less than the threshold voltage, no current may flow if the memory element is in the reset state; if the memory element is in the set state, it may not have a threshold voltage (i.e., a threshold voltage of zero) and, thus, a current may flow in response to the applied voltage. In other cases, the memory cell 105 may have a combination of crystalline and amorphous areas that may result in intermediate resistances, which may correspond to different logic states (i.e., states other than logic 1 or logic 0) and may allow memory cells 105 to store more than two different logic states. As discussed below, the logic state of a memory cell 105 may be set by heating, including melting, the memory element.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels of memory cells 105 and may thus be considered a three-dimensional memory array; however, the number of levels is not limited to two. Each level may be aligned or positioned so that memory cells 105 may be approximately aligned with one another across each level, forming a memory cell stack 145.

Each row of memory cells 105 is connected to an access line 110 and an access line 115. Access lines 110 may also be known as word lines 110, and bit lines 115, respectively. Bit lines 115 may also be known digit lines 115. References to word lines and bit lines, or their analogues, are interchangeable without loss of understanding or operation. Word lines 110 and bit lines 115 may be substantially perpendicular to one another to create an array. The two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible; for example, a storage component of memory cell 105 may be taper-shaped, such as storage component 335 as described with reference to FIG. 3.

In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, a word line 110 and bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and a word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting a word line 110 and bit line 115, which may include applying a voltage or a current to the respective line. Word lines 110 and bit lines 115 may be made of conductive materials, such as metals (e.g., copper (Cu), aluminum (Al), gold (Au), tungsten (W), titanium (Ti), etc.), metal alloys, carbon, conductively-doped semiconductors, or other conductive materials, alloys, or compounds. Upon selecting a memory cell 105, a migration of, for example, selenium (Se) ions may be leveraged to set a logic state of the cell. Additionally or alternatively, ions of other conductive materials may migrate in addition to or in replace of selenium (Se) ions.

For example, a memory cell 105 may be programmed by providing an electric pulse to the cell, which may include a memory storage component. As described above, the memory storage component may include at least a first chalcogenide material and a second chalcogenide material. A distinct pulse (e.g., distinct from the programming pulse described above) may be applied to the storage component, which may result in a mixture of the chalcogenide materials. In some examples, the programming pulse may be then provided to the memory cell 105 via a first access line (e.g., word line 110) or a second access line (e.g., bit line 115), for example. Upon providing the pulse, ions may migrate within the memory storage component, depending on the polarity of the memory cell 105. Thus, a concentration of ions relative to one side of the memory storage component may be based on a polarity of a voltage between the first access line and the second access line. For taper-shaped memory storage components having a tapered profile, such as those described herein, ions may be more crowded at portions of a memory storage component having more area. Ion-rich portions of the memory storage component may have a higher resistivity and thus may give rise to a higher threshold voltage than those portions of the component having relatively fewer ions. So as compared with symmetrically shaped memory storage components, the relative resistance between different portions of the memory storage component may be enhanced.

To read the cell, a voltage may be applied across memory cell 105 and the resulting current or the threshold voltage at which current begins to flow may be representative of a logic "1" or a logic "0" state. The crowding of selenium ions at one or the other ends of memory storage component may affect the resistivity and/or the threshold voltage, resulting in greater distinctions in cell response between logic states.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate bit line 115. Thus, by activating a word line 110 and a bit line 115, a memory cell 105 may be accessed.

Upon accessing, a memory cell 105 may be read, or sensed, by sense component 125. For example, sense component 125 may be configured to determine the stored logic state of memory cell 105 based on a signal generated by accessing memory cell 105. The signal may include a voltage or electrical current, and sense component 125 may include voltage sense amplifiers, current sense amplifiers, or both. For example, a voltage may be applied to a memory cell 105 (using the corresponding word line 110 and bit line 115) and the magnitude of the resulting current may depend on the electrical resistance of the memory cell 105. Likewise, a current may be applied to a memory cell 105 and the magnitude of the voltage to create the current may depend on the electrical resistance of the memory cell 105. Sense component 125 may include various transistors or amplifiers in order to detect and amplify a signal, which may be referred to as latching. The detected logic state of memory cell 105 may then be output as output 135. In some cases, sense component 125 may be a part of column decoder 130 or row decoder 120. Or, sense component 125 may be connected to or in electronic communication with column decoder 130 or row decoder 120.

A memory cell 105 may be programmed, or written, by similarly activating the relevant word line 110 and bit line 115—i.e., a logic value may be stored in the memory cell 105. Column decoder 130 or row decoder 120 may accept data, for example input/output 135, to be written to the memory cells 105. In the case of phase change memory or SSM, a memory cell 105 may be written by heating the memory storage component, for example, by passing a current through the memory storage component. Depending on the logic state written to memory cell 105—e.g., logic "1" or logic "0"—ions may crowd at or near a particular electrode. For example, dependent on the polarity of memory cell 105, ion crowding at or near a first electrode may result in a first threshold voltage representative of a logic "1" state and ion crowding at or near a second electrode may result in a second threshold voltage, different from the first, representative of a logic "0" state. The first threshold voltage and second threshold voltage may, for example, be determined during a read operation performed in a predetermined polarity. As described above, the memory storage component may include a first chalcogenide material and a second chalcogenide material that, ultimately, become a mixture of the chalcogenide materials upon applying a pulse to the memory storage component. The composition of the memory storage component and its shape (e.g., a tapered profile) may each aid in the above-described ion migration. Thus the difference between the first and second threshold voltages may be more pronounced in a memory storage component that is tapered and contains a mixture of multiple chalcogenide materials.

In some memory architectures, accessing the memory cell 105 may degrade or destroy the stored logic state and re-write or refresh operations may be performed to return the original logic state to memory cell 105. In DRAM, for example, the logic-storing capacitor may be partially or completely discharged during a sense operation, corrupting the stored logic state. So the logic state may be re-written after a sense operation. Additionally, activating a single word line 110 may result in the discharge of all memory cells in the row; thus, all memory cells 105 in the row may need to be re-written. But in non-volatile memory, such as PCM and/or SSM, accessing the memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile PCM and/or SSM cells may have beneficial properties that may result in improved performance relative to other memory architectures. For example, PCM and/or SSM may offer comparable read/write speeds as DRAM but may be non-volatile and allow for increased cell density.

The memory controller 140 may control the operation (read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and bit line 115. Memory controller 140 may also generate and control various voltages or currents used during the operation of memory array 100. For example, it may apply discharge voltages to a word line 110 or bit line 115 after accessing one or more memory cells 105.

In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
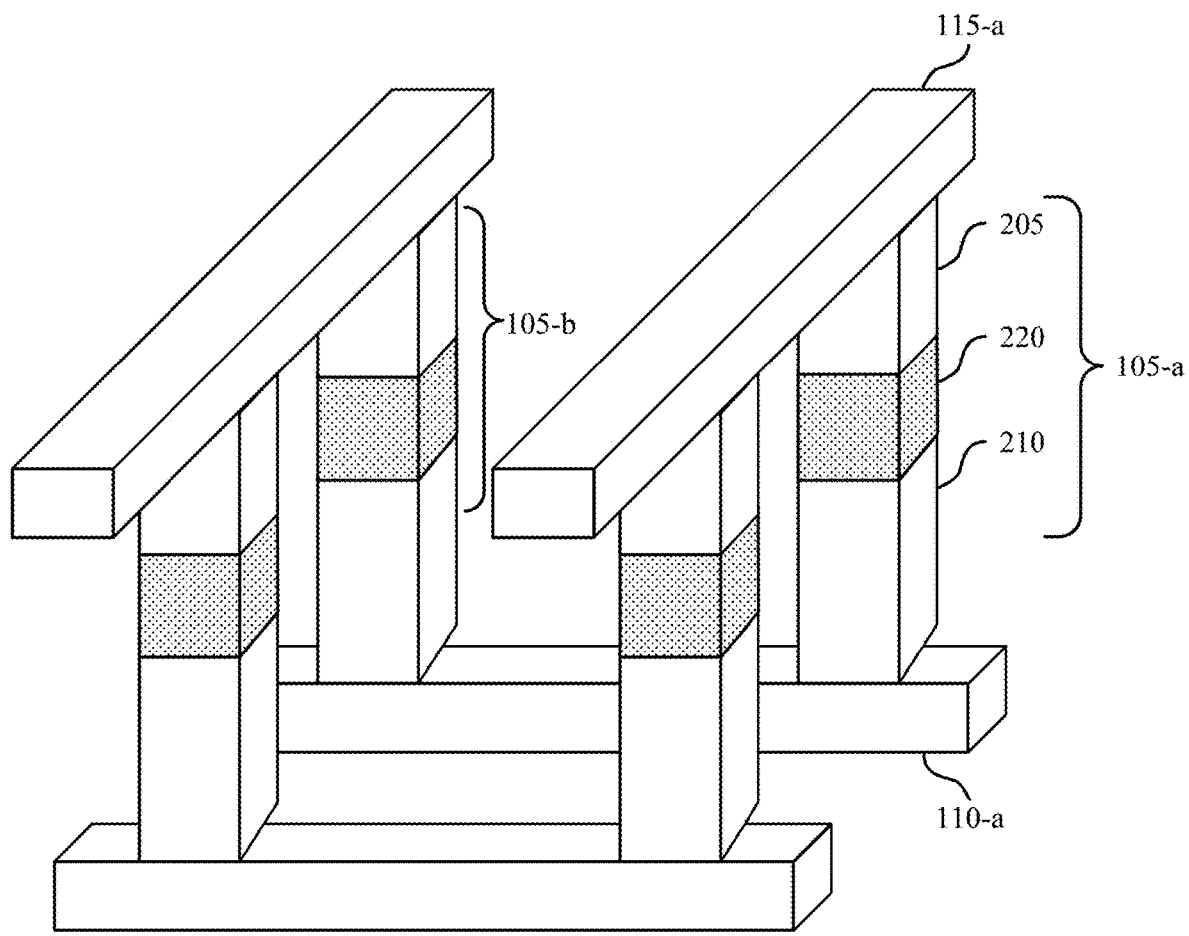
FIG. 2 illustrates an example memory array that supports a tapered cell profile and fabrication in accordance with examples of the present disclosure.

FIG. 2 illustrates an example memory array 200 that supports a tapered cell profile and fabrication in accordance with various examples of the present disclosure. Memory array 200 may be an example of memory array 100 with reference to FIG. 1.

Memory array 200 may include memory cell 105-a, memory cell 105-b, word line 110-a, and bit line 115-a, which may be examples of a memory cell 105, word line 110, and bit line 115, as described with reference to FIG. 1. Memory cell 105-a may include electrode 205 (e.g., top electrode), electrode 210 (e.g., a bottom electrode), and memory storage component 220, which may be referred to as a chalcogenide glass memory storage component and may contain or may be a self-selecting memory (SSM) component. The logic state of memory cell 105-a may be based on at least one characteristic of memory storage component 220. Memory cell 105-b may include a top electrode, bottom electrode, and memory storage component similar to memory cell 105-a. Electrode 205 may be referred to as a top electrode and electrode 210 may be referred to as a bottom electrode. In some cases, a three-dimensional (3D) memory array may be formed by stacking multiple memory arrays 200 on one another. The two stacked arrays may, in some examples, have common conductive lines so each level may share word line 110-a or bit line 115-a. Memory cell 105-a may depict a target memory cell—i.e., a target of a sensing operation, as described elsewhere herein.

The architecture of memory array 200 may be referred to as a cross-point architecture. It may also be referred to as a pillar structure. For example, as shown in FIG. 2, a pillar may be in contact with a first conductive line (e.g., access line such as word line 110-a) and a second conductive line (e.g., access line such as bit line 115-a). The pillar may comprise memory cell 105-a, where memory cell 105-a includes a first electrode (e.g., top electrode 205), memory storage component 220, and a second electrode (e.g., bottom electrode 210). Memory storage component 220 may be a tapered shape (e.g., storage component 335 as described with reference to FIG. 3). This tapered shape may cause ion crowding at the top electrode 205 or bottom electrode 210, depending on the polarity of memory cell 105-a. Ion crowding at top electrode 205 or bottom electrode 210 may allow for more-accurate sensing of memory cell 105-a, as described above.

The cross-point or pillar architecture depicted in FIG. 2 may offer relatively high-density data storage with lower production costs compared to other memory architectures. For example, the cross-point architecture may have memory cells with a reduced area and thus an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

In some examples, memory array 200 may be operated using a positive voltage source and the magnitude of an intermediary voltage is between the magnitude of the positive voltage source and a virtual ground. In some examples, both bit line access voltage and word line access voltage are maintained at an intermediary voltage prior to an access operation of memory cell 105-a. And during an access operation, bit line access voltage may be increased (e.g., to a positive supply rail) while word line access voltage may be simultaneously decreased (e.g., to a virtual ground), generating a net voltage across memory cell 105-a. The threshold voltage at which current begins to flow through cell 105-a as a result of applying a voltage across cell 105-a may be a function of ion migration toward top electrode 205 or bottom electrode 210, which in turn may vary with the shape of memory storage component 220-a.

Memory storage component 220 may, in some cases, be connected in series between a first conductive line and a second conductive line, for example, between word line 110-a and bit line 115-a. For example, as depicted in FIG. 2, memory storage component 220 may be located between top electrode 205 and bottom electrode 210; thus, memory storage component 220 may be located in series between bit line 115-a and word line 110-a. Other configurations are possible. As mentioned above, memory storage component 220 may have a threshold voltage such that a current flows through memory storage component 220 when the threshold voltage is met or exceeded. The threshold voltage may depend on the programing of cell 105-a and the shape of memory storage component 220.

Memory storage component 220 may be configured in a tapered shape to facilitate ion crowding at or near top electrode 205 or bottom electrode 210. As described above with reference to FIG. 1, memory storage component 220 may include at least a first chalcogenide material and a second chalcogenide material. A pulse may be applied to the memory storage component 220, which may result in a mixing of the chalcogenide materials. Thus, in some examples, memory storage component 220 may be referred to as containing a mixture of chalcogenide materials. In other examples, memory storage component 220 may taper—have a tapered profile and may be arranged in a series configuration between the first access line 110-a and second access line 115-a. Additionally or alternatively, one or more of the chalcogenide materials of memory storage component 220 may include a composition of at least one of selenium, arsenic (As), tellurium (Te), silicon (Si), germanium (Ge), or antimony (Sb). Thus, the mixture (e.g., the mixture of a first chalcogenide and second chalcogenide material) may include a combination of any of the above-mentioned materials.

In some examples, a voltage may applied across the memory storage component, resulting in a voltage difference between top electrode 205 and bottom electrode 210. In such an example, ions may migrate toward the top electrode 205 or the bottom electrode 210. For example, some particular ions may migrate toward a positive electrode and other particular ions may migrate toward a negative electrode.

Memory array 200 may be made by various combinations of material formation and removal. For example, layers of material may be deposited that correspond to word line 110-a, bottom electrode 210, memory storage component 220, and top electrode 205. Material may be selectively removed to then create the desired features, such as the structure depicted in FIG. 3 and described below. For example, a stack may be formed that includes a bottom electrode 210, a second conductive material (not shown), a first chalcogenide material (not shown), and top electrode 205. A first plurality of lines may be formed by removing material in a first direction. The lines may be formed in the first chalcogenide material, the second chalcogenide material, and the top electrode 205. Subsequently, a first plurality of pillars may be formed by removing material in a second direction. The pillars may be formed in the top electrode 205, the bottom electrode 210, the first chalcogenide material, and the second chalcogenide material. A memory storage component 220 may then be formed in the first and second chalcogenide materials by applying at least one pulse to the first and second chalcogenide materials.

Additionally or alternatively, features may be defined using photolithography to pattern a photoresist and then material may be removed by techniques such as etching. Bit lines 115-a may then be formed, for example, by depositing a layer of material and selectively etching to form the line structure depicted in FIG. 2. In some cases, electrically insulating regions or layers may be formed or deposited. The electrically insulating regions may include oxide or nitride materials, such as silicon oxide, silicon nitride, or other electrically insulating materials. Exemplary methods of forming such arrays are described with reference to FIGS. 4A through 4I.

Various techniques may be used to form materials or components of memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Figure 3:
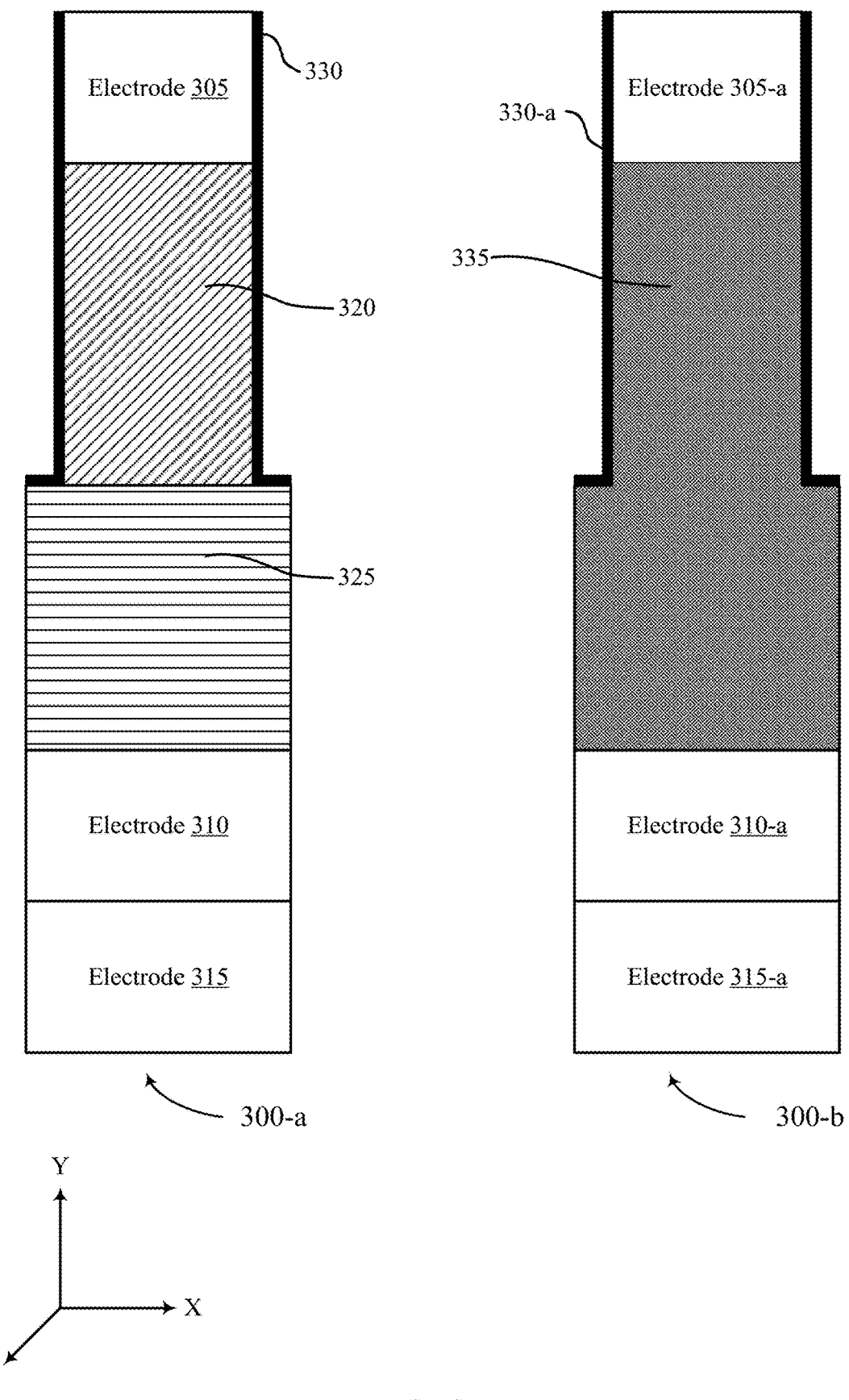
FIG. 3 illustrates an example memory device that supports a tapered cell profile and fabrication in accordance with examples of the present disclosure.

FIG. 3 illustrates example memory devices 300-a and 300-b that support a tapered cell profile and fabrication in accordance with various examples of the present disclosure. Each of memory devices 300-a and 300-b may be examples of various aspects or components of memory arrays 100 and 200 as described with reference to FIGS. 1 and 2, respectively.

In some examples, memory device 300-a may include electrodes 305, 310, and 315, and chalcogenide materials 320 and 325. Memory device 300-a may also include liner 330. Electrode 305 may be referred to as a top electrode 305 or a first electrode 305, electrode 310 may be referred to as a bottom electrode 310 or a second electrode 310, and electrode 315 may also be referred to as a bottom electrode 315 or a third electrode 315. In other examples, chalcogenide material 320 may be referred to as a first chalcogenide material 320 and chalcogenide material 325 may be referred to as a second chalcogenide material 325. As shown in FIG. 3, the first chalcogenide material 320 may be coupled with the first electrode 305 and the second chalcogenide material 325 may be coupled with the second electrode 310.

As described more below with reference to FIGS. 4A through 4I, memory device 300-a may be formed by depositing various materials to form a stack. The stack may include first electrode 305, first chalcogenide material 320, second chalcogenide material 325, second electrode 310, and third electrode 315, or some combination of these. Various removal processes may occur (e.g., etching) to create memory device 300-a. For example, a first removal of material may occur to remove portions of first electrode 305 and first chalcogenide material 320. In some examples, the first chalcogenide material 320 and the second chalcogenide material 325 may be different materials, thus may include different etch rates. The different etch rates may allow for a portion of the first electrode 305 and the first chalcogenide material 320 to be removed during a first removal process, without removing any portion of the second chalcogenide material 325, the second electrode 310, and/or the third electrode.

After the first removal of material, a liner 330 may be deposited on memory device 300-a. In some examples, the liner 330 may be deposited such that it is in contact with at least one side of the first chalcogenide material 320 and at least one side of the second chalcogenide material 325. As described above, the first removal process may remove a portion of the first chalcogenide material 320 but not the second chalcogenide material. Accordingly, for the liner to be in contact with at least one side of the first chalcogenide material 320 and the second chalcogenide material 325, the liner 330 may include a first portion (e.g., a vertical portion) and a second portion (e.g., a horizontal portion). The first portion may be in contact with the first chalcogenide material 320 and the second portion may be in contact with the second chalcogenide material 325. The first and second portions of the liner may extend in different (e.g., orthogonal, intersecting) directions. In some examples, the liner 330 may be may be deposited such that it is in contact with at least one side of the first chalcogenide material 320 and etched back, so that it may behave as a spacer for underlying second chalcogenide material 325 (not shown).

As shown in FIG. 3, the second chalcogenide material 325 may have a larger dimension than the first chalcogenide material 320 in at least one direction (e.g., a horizontal direction). As described below, the different dimensions of the first chalcogenide material 320 and the second chalcogenide material 325 may result in a memory storage component having a tapered profile. For example, the first chalcogenide material 320 and the second chalcogenide material 325 may be tapered about a particular axis (e.g., an "Y" axis). Stated another way, the second chalcogenide material 325 may have a larger dimension in at least one direction (e.g., in a "X" direction) than the first chalcogenide material 320. This may be referred to as a "stepped taper."

In other examples, the taper may be referred to as a "smooth taper," where the first chalcogenide material 320 and the second chalcogenide material form a conical-like, or a pyramid-like shape.

After the liner 330 is deposited, a second removal of material may occur to remove portions of second chalcogenide material 325, the second electrode 310, and the third electrode 315. In some examples, a dimension of the second portion of the liner 330 may affect the removal of the second chalcogenide material 325, the second electrode 310, and the third electrode 315. For example, the liner 330 may serve as a barrier to prevent any portions of the first electrode 305 and the first chalcogenide material 320 from being removed during the second removal process. Because the liner 330 may serve as a barrier, and because the second portion of the liner 330 may be in contact with the second chalcogenide material 325, the liner 330 may allow for the second chalcogenide material 325, via the second removal process, to have a larger dimension than the first chalcogenide material 320 in at least one direction. Stated another way, first chalcogenide material 320 and second chalcogenide material 325 may be taper-shaped due to the deposition of the liner 330.

In some examples, the first and second removal of materials, as described above, may be conducted in a single processing step and may be referred to as creating lines in the stack of materials. The lines may be created in a first direction (e.g., an "Y" direction). As described below, additional material may be removed in a second direction (e.g., a "Z" direction), which may be referred to as creating pillars in the stack of materials. Thus memory device 300-a may be one of a plurality of memory devices formed during a fabrication process.

In some examples (not shown), the memory device 300-a may include a plurality of chalcogenide materials. For example, the memory device 300-a may include a third chalcogenide material coupled with the second chalcogenide material 325 and the second electrode 310. In such an example, each chalcogenide material may include a different dimension in at least one direction (e.g., an "X" direction). For example, a portion of first electrode 305 and first chalcogenide material 320 may be removed, and a portion of liner 330 may be deposited. A portion of the second chalcogenide material 325 may then be removed, and an additional portion of liner 330 may be deposited. A portion of the third chalcogenide material (not shown), the second electrode 310 and the third electrode 315 may then be removed, resulting in a memory device with tapered-shaped chalcogenide materials. As described above, the chalcogenide materials may be in the shape of a "stepped taper" or in the shape of a "smooth taper."

In other examples memory device 300-a may include a second storage component. The second storage component may, for example, include the first chalcogenide material and the second chalcogenide material. In some examples, the second storage component may be inactive. As described below, a voltage may be applied to the first chalcogenide material 320 and the second chalcogenide material 325 to form a mixture. This step may be omitted as to the second storage component. Meaning that, in some examples, the second storage component may not include a mixture of the first and second chalcogenide materials, but rather include the materials in a separated form. In some examples, the second storage component may be coupled with the first storage component or, in other examples, may be located at a border of the memory array (e.g., the memory array 200 as described with reference to FIG. 2) or in a dummy region of the array.

In other examples, the first electrode 305, the second electrode 310, and the third electrode 315 may include same or different materials. For example, the first electrode 305 and the second electrode 310 may each include Carbon (C), and the third electrode may include Tungsten (W). In other examples, each of the electrodes may include any combination of Carbon, Tungsten, or an additional material(s). Additionally or alternatively, each of the first electrode 305, the second electrode 310, and the third electrode 315 may include or be referred to as conductive materials. One of the conductive materials may serve as a word line (e.g., word line 110 as described with reference to FIG. 1), and one of the materials may serve as a bit line (e.g., bit line 115 as described with reference to FIG. 1). For example, first electrode 305 may be a digit line and third electrode 315 may be a word line. In other examples, an additional conductive material (e.g., a fourth conductive material) may be deposited above the first electrode 305. The fourth conductive material may, in some examples, contain Tungsten, and may serve as a digit line.

In some examples, memory device 300-b may include electrodes 305-a, 310-a, and 315-a, which may be examples of electrodes 305, 310, and 315, respectively, as described with reference to memory device 300-a. Memory device 300-b may also include liner 330-a, which may be an example of liner 330 as described with reference to memory device 300-a, and storage component 335. As shown in FIG. 3, the storage component 335 may be coupled with electrodes 305-a and 310-a, respectively.

To form storage component 335, memory device 300-b may first be formed in a same manner as memory device 300-a, described above. A pulse may then be applied to the first chalcogenide material (e.g., first chalcogenide material 320) and the second chalcogenide material (e.g., second chalcogenide material 325) to form storage component 335. The pulse may be applied, for example, to electrode 305-a or electrode 315-a, and may result in a mixture of the first chalcogenide material and the second chalcogenide material. Thus storage component 335 may be referred to as a mixture of the first chalcogenide material and the second chalcogenide material. As described above, in some examples the memory device 300-b may include additional chalcogenide materials. In such examples, applying a pulse to memory device 300-b may result a storage component 335 that includes a mixture of each of the chalcogenide materials.

Figure 4A:
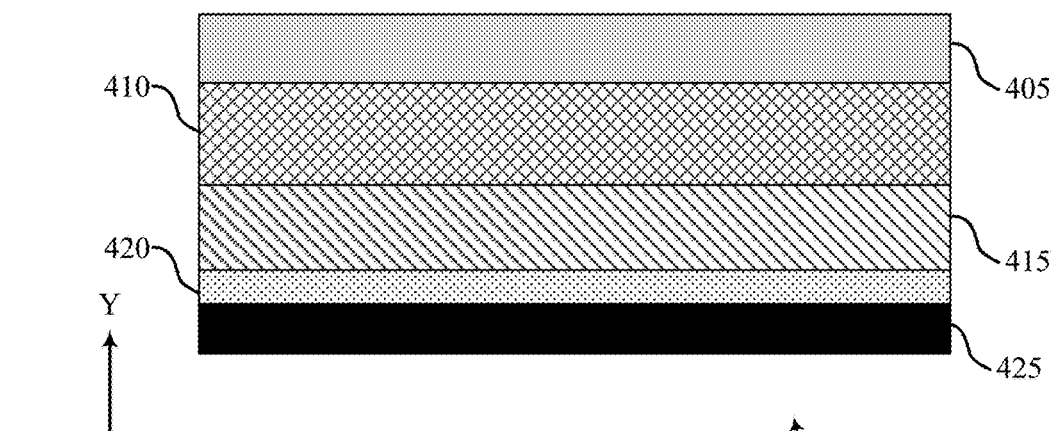

FIGS. 4A through 4I illustrate example methods of forming a tapered cell profile in accordance with examples of the present disclosure. In FIG. 4A, processing step 400-a is depicted. In processing step 400-a, a stack may be formed that includes a first conductive material 405, which may be an example of first electrode 305 as described with reference to FIG. 3; a second conductive material 420, which may be an example of second electrode 310 as described with reference to FIG. 3; and a third conductive material 425, which may be an example of third electrode 315 as described with reference to FIG. 3. In some examples, the stack may also include a first chalcogenide material 410, which may be an example of first chalcogenide material 320 as described with reference to FIG. 3; and a second chalcogenide material 415, which may be an example of second chalcogenide material 325 as described with reference to FIG. 3. In some examples, the first chalcogenide material 410 and the second chalcogenide material 415 may be between the first conductive material 405 and the second conductive material 420, respectively. Thus, FIG. 4A depicts the formation of a stack that includes various layers, including a first conductive material 405, a second conductive material 420, and a third conductive material 425, and a first chalcogenide material 410 and a second chalcogenide material 415. The layers may be formed, for example, by a deposition process.

Figure 4B:
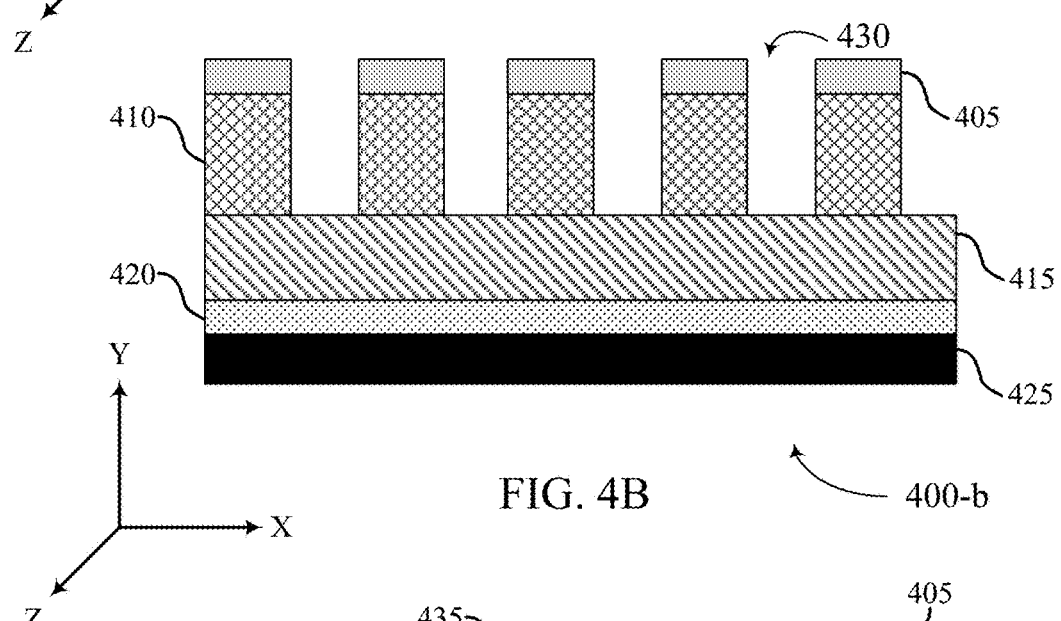

In FIG. 4B, processing step 400-b is depicted. In processing step 400-b a removal of material in a first direction (e.g., a "Y" direction) may occur. In some examples, processing step 400-b may be referred to as a first removal of material along a first direction. The removal of material to form a channel along the first direction may form a plurality of lines 430 in the first conductive material 405 and the first chalcogenide material 410 that extend lengthwise along the first direction (e.g., a "Y" direction). In some examples, the lines 430 may include a same dimension in a first direction (e.g., a "Y" direction) and in a second direction (e.g., an "X" direction). The lines 430 may extend parallel to each other in at least one direction. In another example, at least one of the lines 430 may include a different dimension in a first direction (e.g., a "Y" direction) or in a second direction (e.g., an "X" direction). For example, at least one of the lines 430 may include a different width (e.g., a different dimension in an "X" direction).

Figure 4C:
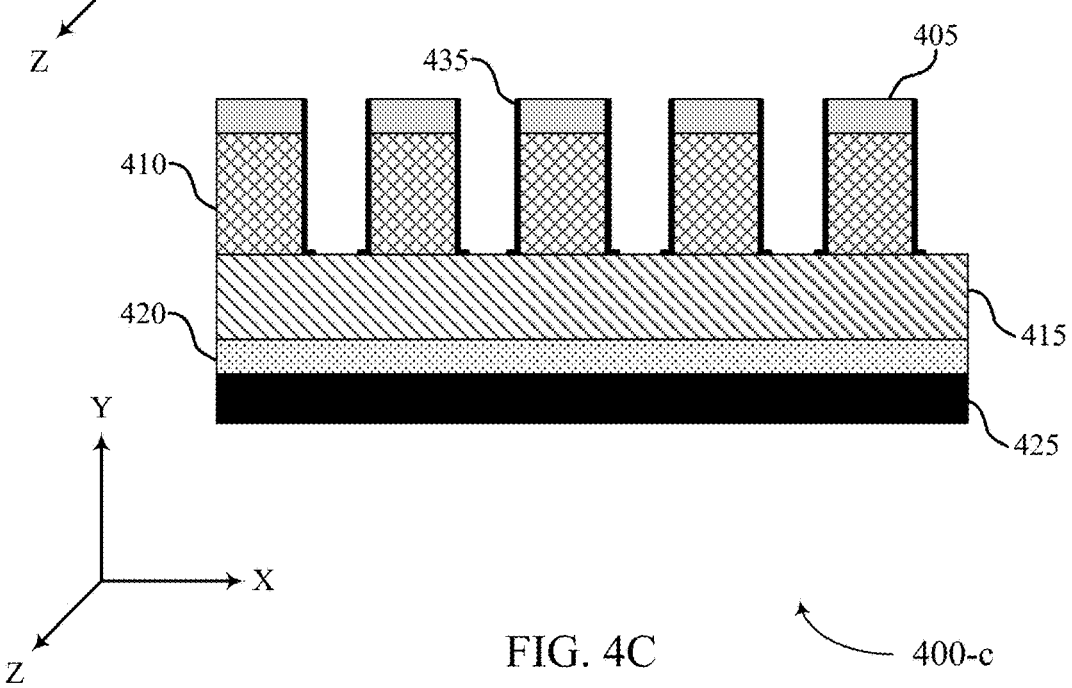

In FIG. 4C, processing step 400-c is depicted. In processing step 400-c a liner 435 may be deposited that is in contact with a portion of the first chalcogenide material 410 and the second chalcogenide material 415. The liner may also be in contact with first conductive material 405. For example, the liner 435 may be deposited such that it is in contact with a side of each of the first conductive material 405 and the first chalcogenide material 410. Additionally or alternatively, the liner 435 may be deposited such that it is in contact with at least a portion of a side (e.g., a top side) of the second chalcogenide material 415. The liner 435 may extend along at least a portion of the second chalcogenide material 415 (e.g., in a "Z" direction). In other examples, portions of the liner 435 may be etched, thus exposing one or more regions of the second chalcogenide material 415.

Figure 4D:
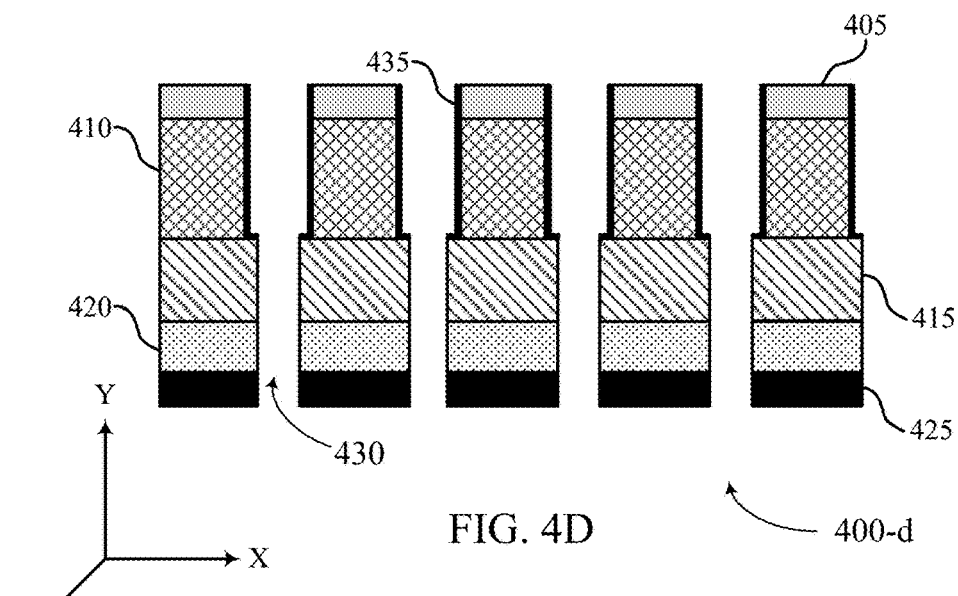

In FIG. 4D, processing step 400-d is depicted. In processing step 400-d a removal of material in a first direction (e.g., a "Y" direction) may occur. In some examples, processing step 400-d may be referred to as a second removal of material in a first direction. The removal of material may form a plurality of lines (e.g., lines 430) in the second chalcogenide material 415, the second conductive material 420, and the third conductive material 425. In conjunction with 400-b described above, processing step 400-d may be referred to as a second removal of material in a first direction. Thus, in some examples, the removal of material in a first direction may be referred to forming a plurality of lines (e.g., lines 430) in the first conductive material 405, the second conductive material 420, the first chalcogenide material 410, the second chalcogenide material 415, and the third conductive material 425. In some examples, depositing the liner 435 at processing step 400-c may facilitate the second removal of material in the first direction at processing step 400-d. More specifically, the liner 435 may prevent the first chalcogenide material 410 from being etched during processing step 400-d. For example, the liner 435 may allow for the first chalcogenide material 410 and the second chalcogenide material 45 to have a tapered profile. As described above, the taper may be a "stepped taper" or a "smooth taper," among other tapered profiles. In other examples, processing step 400-c may be omitted (e.g., a liner may not be deposited at this step or at a later step) and the plurality of lines 430 may be formed in one processing step (e.g., during a first removal of material).

Figure 4E:
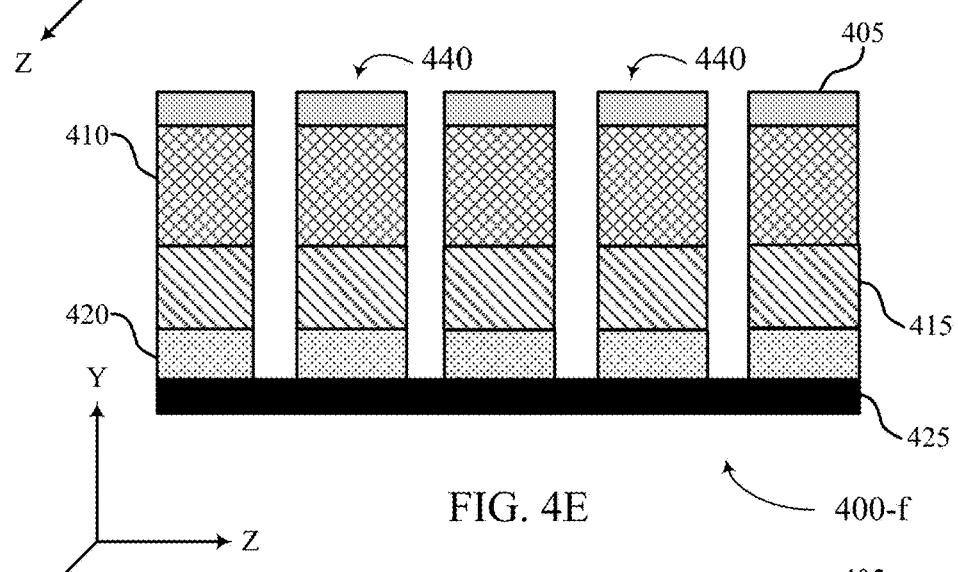

In FIG. 4E, processing step 400-e is depicted. In processing step 400-e a removal of material in a second direction may occur. The first direction and the second direction may be orthogonal, in some examples, thus forming a plurality of pillars 440. The plurality of pillars may be formed in the first conductive material 405, the second conductive material 420, the first chalcogenide material 410, and the second chalcogenide material 415, or some combination thereof.

Figure 4F:
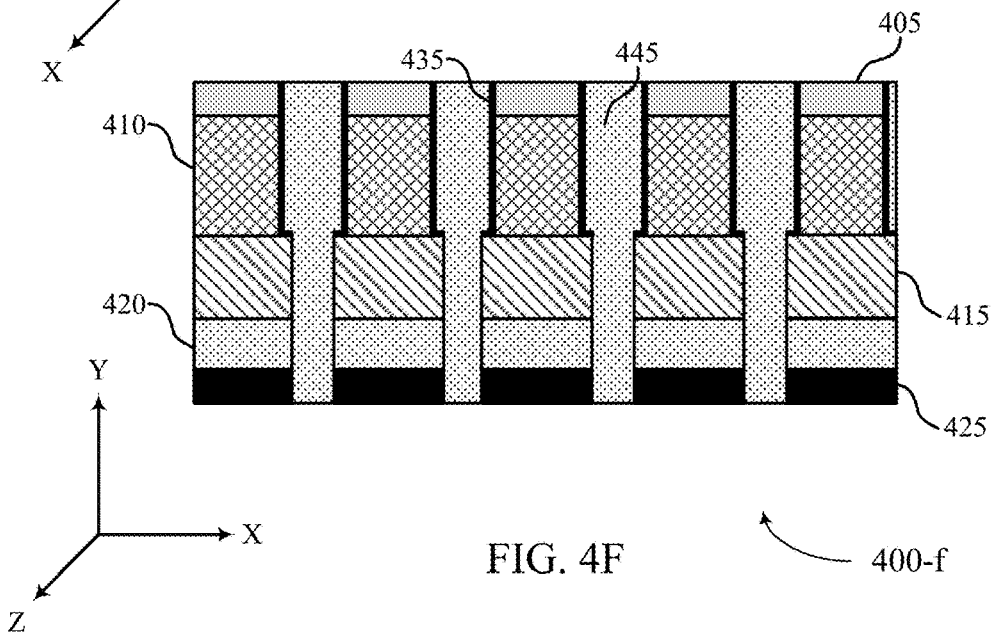

In FIG. 4F, processing step 400-f is depicted. In processing step 400-f a dielectric material 445 may be deposited. Dielectric material 445 may be deposited such that it is in contact with the plurality of pillars (e.g., pillars 440) after removing material in the first direction (e.g., processing steps 400-b and 400-d) and in the second direction (e.g., processing step 400-e).

In FIG. 4G, processing step 400-g is depicted. In processing step 400-g a fourth conductive material 450 may be deposited. The fourth conductive material 450 may be deposited above the first conductive material 405 and, as depicted in FIG. 4G, may extend in a direction orthogonal to the plurality of pillars (e.g., pillars 440). In some examples, fourth conductive material 450 may be deposited before a removal of material in the second direction (e.g., processing step 400-e). Accordingly, removal of material in the second direction may form a plurality of pillars in the first conductive material 405, the second conductive material 420, the first chalcogenide material 410, and the second chalcogenide material 415. In some examples, the fourth conductive material 450 may be a same or different material as each of the first conductive material 405, the second conductive material 420, and the third conductive material 425, or some combination thereof.

In FIG. 4H, processing step 400-h is depicted. In processing step 400-h a plurality of storage components 455 may be formed. Each storage component 455 may include a mixture of the first chalcogenide material (e.g., first chalcogenide material 410) and the second chalcogenide material (e.g., chalcogenide material 415) as described in FIGS. 4A through 4G. The storage components 455 may be depicted from a same perspective as at least FIGS. 4C and 4D (e.g., showing a plurality of lines). In some examples, the first chalcogenide material and the second chalcogenide material may be different materials, thus the storage components 455 may be a mixture of two otherwise distinct chalcogenide materials. Each of the storage components formed during processing step 400-h may include a first surface and a second surface opposite the first surface, where the second surface has a greater area than the first surface. Stated another way, each storage component 455 may be taper-shaped tapered in at least one direction (e.g., tapered in a "Y" direction), resulting in a tapered profile such as a "stepped taper" or a "smooth taper."

In FIG. 4I, processing step 400-i is depicted. In some examples, processing step 400-i may be a same processing step as processing step 400-h, and FIG. 4I depicts the result from a different perspective. For example, processing step 400-h may be depicted from a same perspective as at least FIGS. 4C and 4D, and processing step 400-i may be depicted from a same perspective as at least FIG. 4E.

In some examples (not shown), processing steps may occur to form a second deck that includes an additional storage component. In such an example, the processing steps depicted in FIGS. 4A through 4I may form a first deck that includes a storage component. A second deck may be formed using the same or similar processing steps, and may be coupled with the first deck. Accordingly, the second deck may include a second storage component that includes a mixture of a plurality of chalcogenide materials. In some examples, each of the decks may include different materials. For example, the first chalcogenide material of the first deck may be different than a first chalcogenide material of the second deck. In other examples, the second chalcogenide material of the first deck may be different than a second chalcogenide material of the second deck. Additionally or alternatively, each deck may include a different quantity of chalcogenide materials. For example, the first deck may include more of a first chalcogenide material than the second deck. In other examples, the second deck may include more of a second chalcogenide material than the first deck. Accordingly, the composition of the memory storage component of each deck may differ in terms of a composition of chalcogenide materials.

Figure 5:
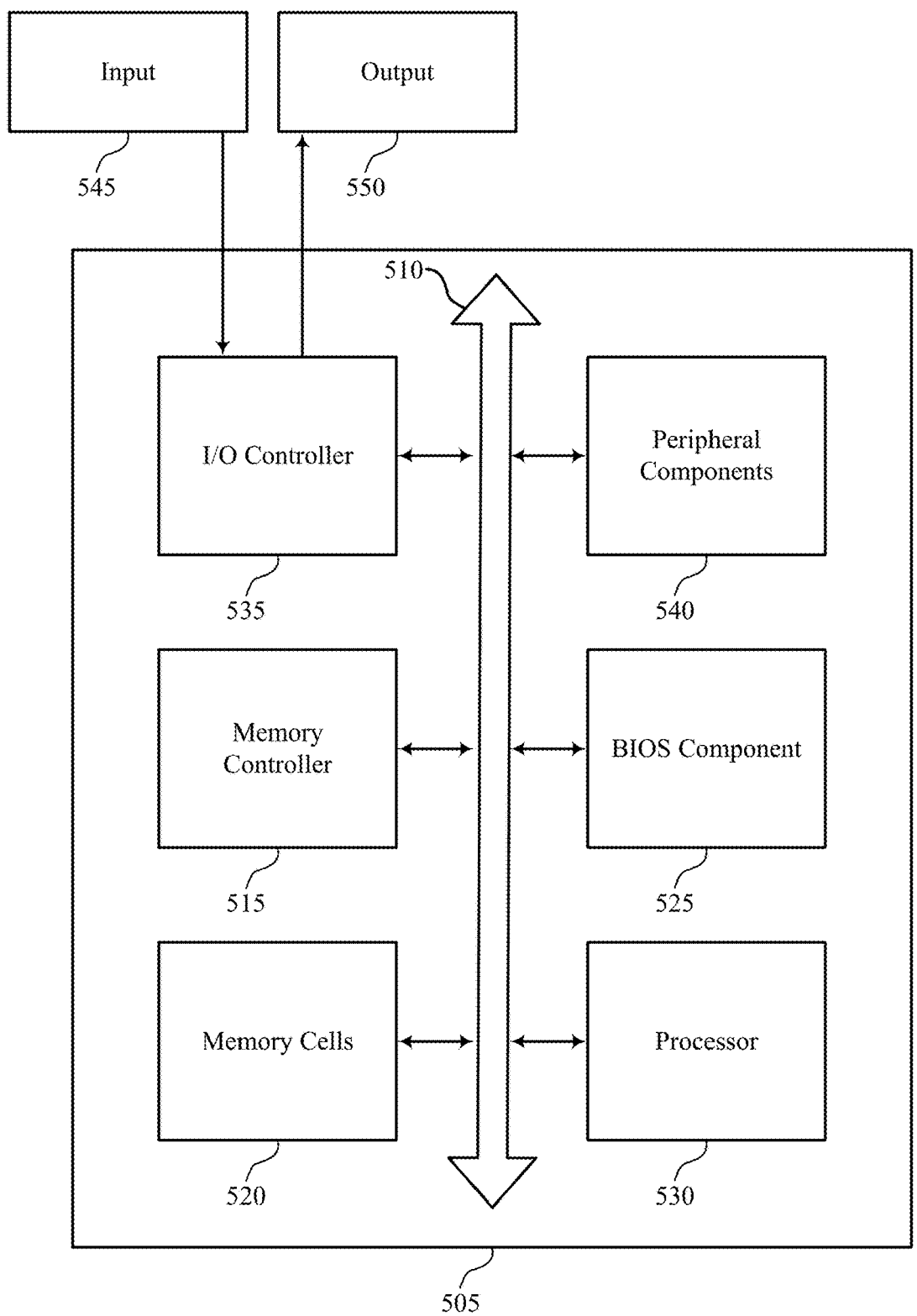
FIG. 5 illustrates a block diagram of a system including a memory array that supports a tapered cell profile in accordance with examples of the present disclosure.

FIG. 5 shows a diagram of a system 500 including a device 505 that supports a tapered cell profile and fabrication in accordance with examples of the present disclosure. Device 505 may be an example of or include the components of memory array 100 as described above, e.g., with reference to FIG. 1. Device 505 may include components for bi-directional voice and data communications including components for transmitting and receiving communications, including mem memory controller 515, memory cells 520, BIOS component 525, processor 530, I/O controller 535, and peripheral components 540. These components may be in electronic communication via one or more buses (e.g., bus 510).

Memory cells 520 may store information (i.e., in the form of a logical state) as described herein.

BIOS component 525 be a software component that includes BIOS operated as firmware, which may initialize and run various hardware components. BIOS component 525 may also manage data flow between a processor and various other components, e.g., peripheral components, input/output control component, etc. BIOS component 525 may include a program or software stored in ROM, flash memory, or any other non-volatile memory.

Processor 530 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 530 may be configured to operate a memory array using a memory controller. In other cases, a memory controller may be integrated into processor 530. Processor 530 may be configured to execute computer-readable instructions stored in a memory to perform various functions (e.g., functions or tasks supporting a tapered cell profile and fabrication).

I/O controller 535 may manage input and output signals for device 505. I/O controller 535 may also manage peripherals not integrated into device 505. In some cases, I/O controller 535 may represent a physical connection or port to an external peripheral. In some cases, I/O controller 535 may utilize an operating system such as iOS®, ANDROID®, MS-DOS®, MS-WINDOWS®, OS/2®, UNIX®, LINUX®, or another known operating system. In other cases, I/O controller 535 may represent or interact with a modem, a keyboard, a mouse, a touchscreen, or a similar device. In some cases, I/O controller 535 may be implemented as part of a processor. In some cases, a user may interact with device 505 via I/O controller 535 or via hardware components controlled by I/O controller 535.

Peripheral components 540 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 545 may represent a device or signal external to device 505 that provides input to device 505 or its components. This may include a user interface or an interface with or between other devices. In some cases, input 545 may be managed by I/O controller 535, and may interact with device 505 via a peripheral component 540.

Output 550 may also represent a device or signal external to device 505 configured to receive output from device 505 or any of its components. Examples of output 550 may include a display, audio speakers, a printing device, another processor or printed circuit board, etc. In some cases, output 550 may be a peripheral element that interfaces with device 505 via peripheral component(s) 540. In some cases, output 550 may be managed by I/O controller 535.

The components of device 505 may include circuitry designed to carry out their functions. This may include various circuit elements, for example, conductive lines, transistors, capacitors, inductors, resistors, amplifiers, or other active or inactive elements, configured to carry out the functions described herein. Device 505 may be a computer, a server, a laptop computer, a notebook computer, a tablet computer, a mobile phone, a wearable electronic device, a personal electronic device, or the like. Or device 505 may be a portion or aspect of such a device.

Figure 6:
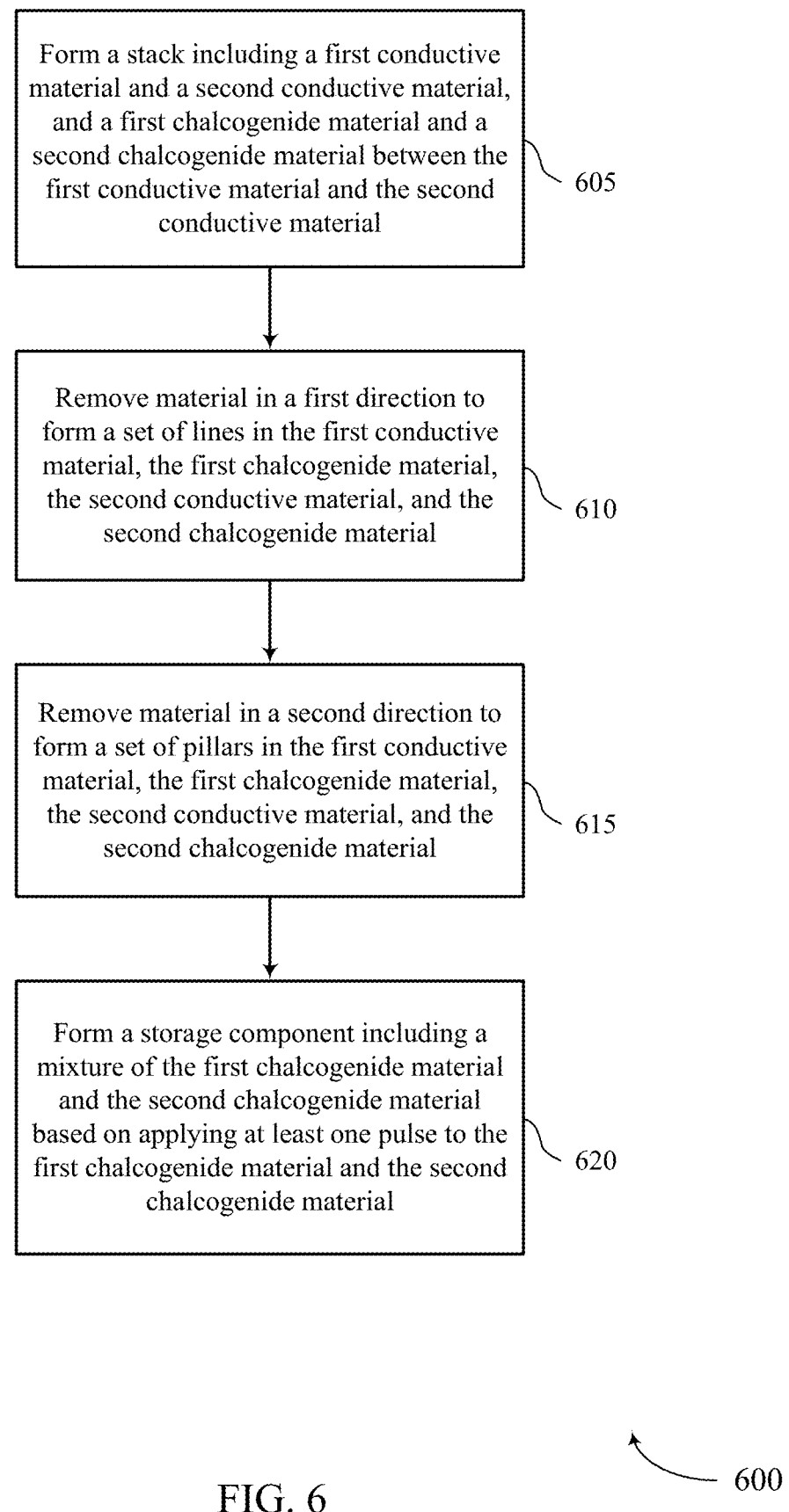
FIGS. 6 through 9 illustrate methods of forming memory arrays that support a tapered cell profile in accordance with examples of the present disclosure.

FIG. 6 shows a flowchart illustrating a method 600 of forming a tapered cell profile in accordance with examples of the present disclosure. The operations of method 600 may be implemented by the method described herein, for example with reference to FIGS. 4A through 4H.

At 605 a stack may be formed that includes a first conductive material and a second conductive material, and a first chalcogenide material and a second chalcogenide material between the first conductive material and the second conductive material. The operations of 605 may be performed according to the methods described herein. In certain examples, aspects of the operations of 605 may be performed by one or more processes described with reference to FIGS. 4A through 4H.

At 610 a removal of material in a first direction may occur, to form a plurality of lines in the first conductive material, the first chalcogenide material, the second conductive material, and the second chalcogenide material. The operations of 610 may be performed according to the methods described herein. In certain examples, aspects of the operations of 610 may be performed by one or more processes described with reference to FIGS. 4A through 4H.

At 615 a removal of material in a second direction may occur, to form a plurality of pillars in the first conductive material, the first chalcogenide material, the second conductive material, and the second chalcogenide material. The operations of 615 may be performed according to the methods described herein. In certain examples, aspects of the operations of 615 may be performed by one or more processes described with reference to FIGS. 4A through 4H.

At 620 a storage component may be formed that includes a mixture of the first chalcogenide material and the second chalcogenide material. The storage component may be formed based at least in part on applying at least one pulse to the first chalcogenide material and the second chalcogenide material. The operations of 620 may be performed according to the methods described herein. In certain examples, aspects of the operations of 620 may be performed by one or more processes described with reference to FIGS. 4A through 4H.

Figure 7:
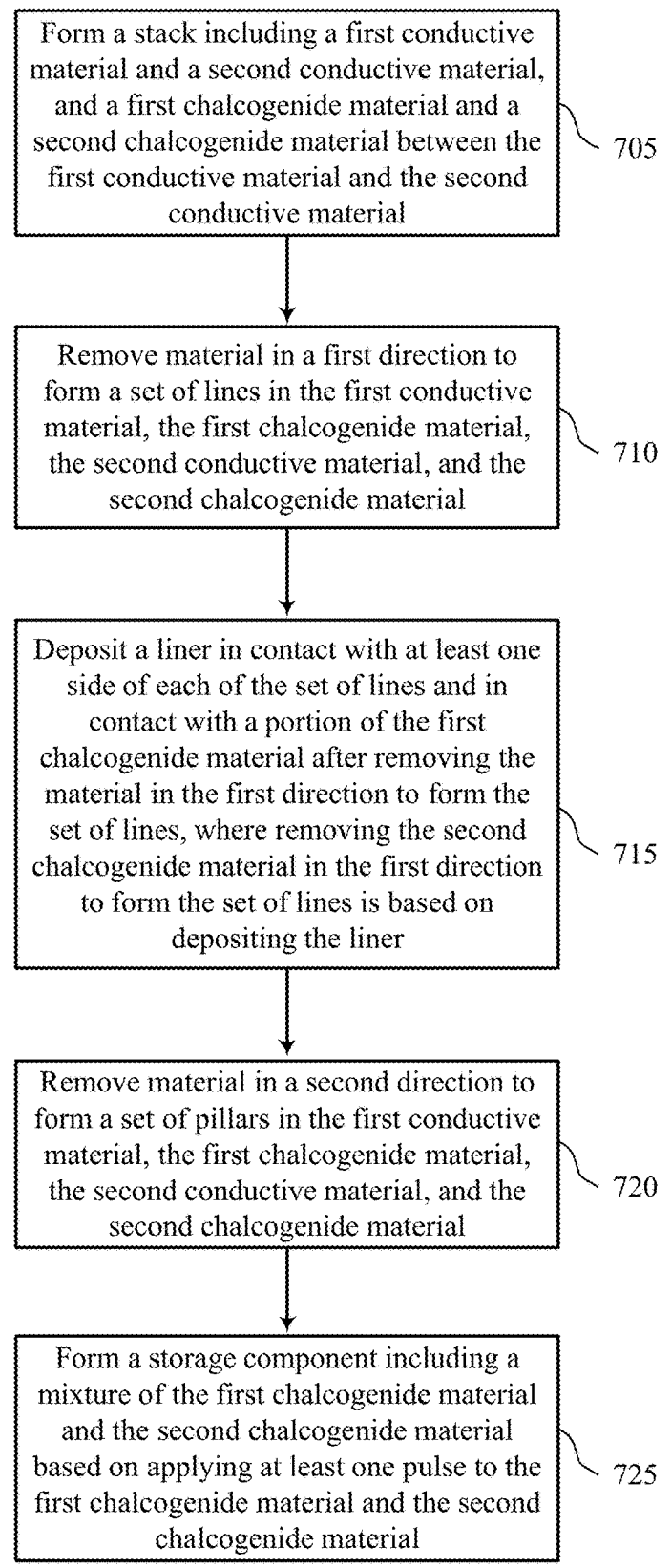

FIG. 7 shows a flowchart illustrating a method 700 of forming a tapered cell profile in accordance with examples of the present disclosure. The operations of method 700 may be implemented by the method described herein, for example with reference to FIGS. 4A through 4H.

At 705 a stack may be formed that includes a first conductive material and a second conductive material, and a first chalcogenide material and a second chalcogenide material between the first conductive material and the second conductive material. The operations of 705 may be performed according to the methods described herein. In certain examples, aspects of the operations of 705 may be performed by one or more processes described with reference to FIGS. 4A through 4H.

At 710 a removal of material in a first direction may occur, to form a plurality of lines in the first conductive material, the first chalcogenide material, the second conductive material, and the second chalcogenide material. The operations of 710 may be performed according to the methods described herein. In certain examples, aspects of the operations of 710 may be performed by one or more processes described with reference to FIGS. 4A through 4H.

At 715 a liner may be deposited that is in contact with at least one side of each of the plurality of lines and in contact with a portion of the first chalcogenide material. The liner may be deposited after removing the material in the first direction to form the plurality of lines. In some examples, removing the second chalcogenide material in the first direction to form the plurality of lines may be based at least in part on depositing the liner. The operations of 715 may be performed according to the methods described herein. In certain examples, aspects of the operations of 715 may be performed by one or more processes described with reference to FIGS. 4A through 4H.

At 720 a removal of material in a second direction may occur, to form a plurality of pillars in the first conductive material, the first chalcogenide material, the second conductive material, and the second chalcogenide material. The operations of 720 may be performed according to the methods described herein. In certain examples, aspects of the operations of 720 may be performed by one or more processes described with reference to FIGS. 4A through 4H.

At 725 a storage component may be formed that includes a mixture of the first chalcogenide material and the second chalcogenide material. The storage component may be formed based at least in part on applying at least one pulse to the first chalcogenide material and the second chalcogenide material. The operations of 725 may be performed according to the methods described herein. In certain examples, aspects of the operations of 725 may be performed by one or more processes described with reference to FIGS. 4A through 4H.

In some cases, the method may also include forming a stack that includes a first conductive material and a second conductive material, and a first chalcogenide material and a second chalcogenide material between the first conductive material and the second conductive material. The first chalcogenide material may include a first etch rate and the second chalcogenide material may include a second etch rate different from the first etch rate, wherein removing the first chalcogenide material in the direction to form the plurality of lines and removing the second chalcogenide material in the first direction to form the plurality of lines is based at least in part on the first etch rate and the second etch rate.

In some examples, the method may also include removing material in a second direction to form a plurality of pillars in the first conductive material, the first chalcogenide material, the second conductive material, and the second chalcogenide material. In some cases, the method may include forming a storage component that includes a mixture of the first chalcogenide material and the second chalcogenide material based at least in part on applying at least one pulse to the first chalcogenide material and the second chalcogenide material. The method may also include depositing a liner in contact with at least one side of each of the plurality of lines and in contact with a portion of the first chalcogenide material after removing the material in the first direction to form the plurality of lines. In some examples, removing the second chalcogenide material in the first direction to form the plurality of lines may be based at least in part on depositing the liner.

In other cases, the method may include depositing a dielectric material in contact with the plurality of lines after removing the material in the first direction to form the plurality of lines. In some cases, the method may include depositing a third conductive material over the second conductive material after depositing the dielectric material. The method may also include removing material in a first direction to form a plurality of lines in the first conductive material, the first chalcogenide material, the second conductive material, and the second chalcogenide material. In some examples, the method may include depositing a fourth conductive material before depositing the first conductive material. Removing the material in the first direction to form the plurality of lines may include removing the fourth conductive material.

Additionally or alternatively, the first conductive material, the second conductive material, the third conductive material, and the fourth conductive material may include at least one of carbon or tungsten. In some cases, a dimension of the first chalcogenide material and the first conductive material may be different than a dimension of the second chalcogenide material and the second conductive material in the first direction. In some examples, the stack further includes a third chalcogenide material between the first conductive material and the second conductive material, and the plurality of lines may include the third chalcogenide material.

The method may also include determining a composition of at least one of the first chalcogenide material and the second chalcogenide material, and the at least one pulse may be applied based at least in part on determining the composition. In some cases, the method may include removing a portion of the dielectric material, the second conductive material, the third conductive material, the first chalcogenide material, the second chalcogenide material and the first conductive material in the second direction to form plurality of pillars.

Figure 8:
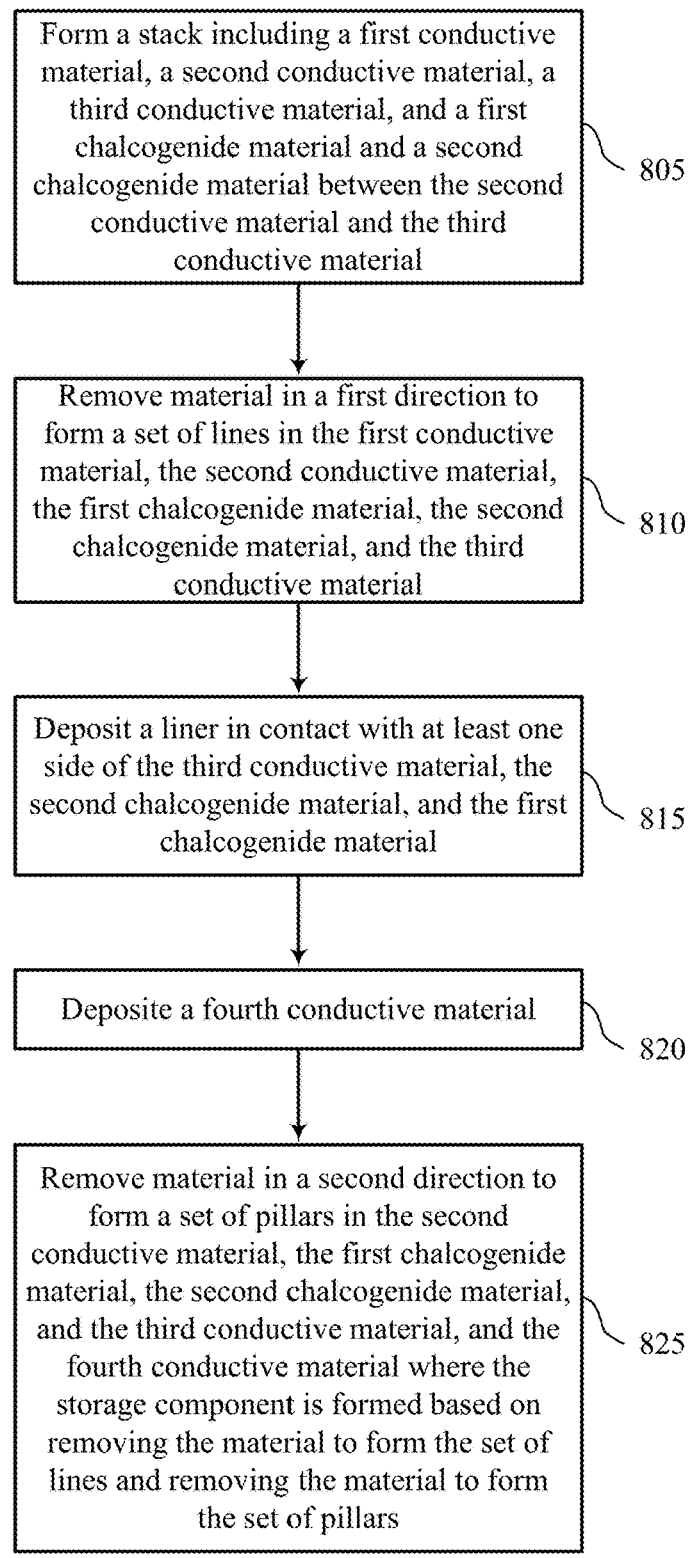

FIG. 8 shows a flowchart illustrating a method 800 of forming a tapered cell profile in accordance with examples of the present disclosure. The operations of method 800 may be implemented by the method described herein, for example with reference to FIGS. 4A through 4H.

At 805 a stack may be formed that includes a first conductive material, a second conductive material, a third conductive material, and a first chalcogenide material and a second chalcogenide material between the second conductive material and the third conductive material. The operations of 805 may be performed according to the methods described herein. In certain examples, aspects of the operations of 805 may be performed by one or more processes described with reference to FIGS. 4A through 4H.

At 810 a removal of material in a first direction may occur, to form a plurality of lines in the first conductive material, the second conductive material, the first chalcogenide material, the second chalcogenide material, and the third conductive material. The operations of 810 may be performed according to the methods described herein. In certain examples, aspects of the operations of 810 may be performed by one or more processes described with reference to FIGS. 4A through 4H.

At 815 a liner may be deposited that is in contact with at least one side of the third conductive material, the second chalcogenide material, and the first chalcogenide material. The operations of 815 may be performed according to the methods described herein. In certain examples, aspects of the operations of 815 may be performed by one or more processes described with reference to FIGS. 4A through 4H.

At 820 a fourth conductive material may be deposited. The operations of 820 may be performed according to the methods described herein. In certain examples, aspects of the operations of 820 may be performed by one or more processes described with reference to FIGS. 4A through 4H.

At 825 the a removal of material in a second direction may occur, to form a plurality of pillars in the second conductive material, the first chalcogenide material, the second chalcogenide material, and the third conductive material, and the fourth conductive material. In some examples, the storage component may be formed based at least in part on removing the material to form the plurality of lines and removing the material to form the plurality of pillars. The operations of 825 may be performed according to the methods described herein. In certain examples, aspects of the operations of 825 may be performed by one or more processes described with reference to FIGS. 4A through 4H.

Figure 9:
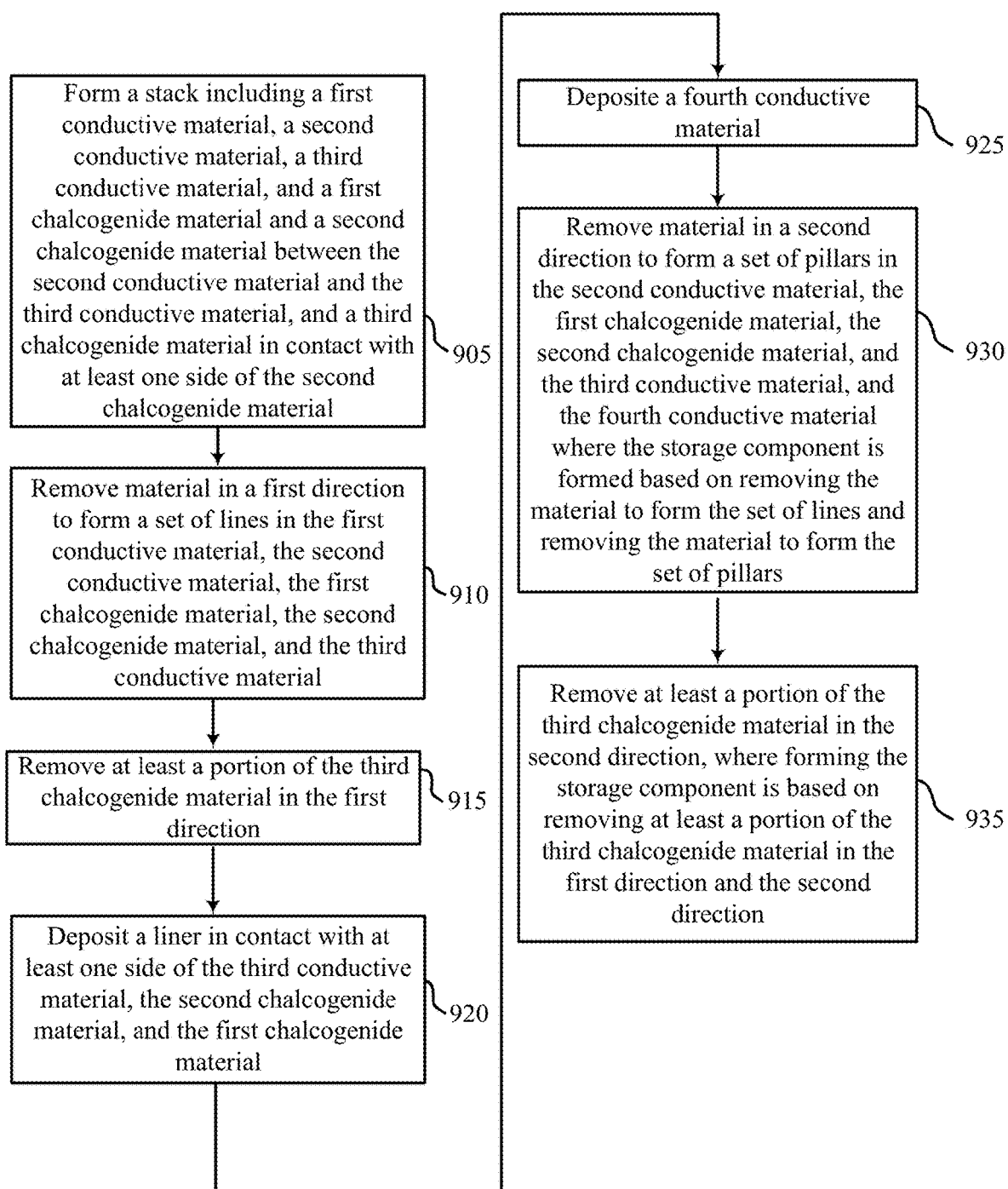

FIG. 9 shows a flowchart illustrating a method 800 of forming a tapered cell profile in accordance with examples of the present disclosure. The operations of method 800 may be implemented by the method described herein, for example with reference to FIGS. 4A through 4H.

At 905 a stack may be formed that includes a first conductive material, a second conductive material, a third conductive material, and a first chalcogenide material and a second chalcogenide material between the second conductive material and the third conductive material. The operations of 905 may be performed according to the methods described herein. In certain examples, aspects of the operations of 905 may be performed by one or more processes described with reference to FIGS. 4A through 4H.

At 910 a removal of material in a first direction may occur, to form a plurality of lines in the first conductive material, the second conductive material, the first chalcogenide material, the second chalcogenide material, and the third conductive material. The operations of 910 may be performed according to the methods described herein. In certain examples, aspects of the operations of 910 may be performed by one or more processes described with reference to FIGS. 4A through 4H.

At 915 at least a portion of the third chalcogenide material may be removed in the first direction. The operations of 915 may be performed according to the methods described herein. In certain examples, aspects of the operations of 915 may be performed by one or more processes described with reference to FIGS. 4A through 4H.

At 920 a liner may be deposited that is in contact with at least one side of the third conductive material, the second chalcogenide material, and the first chalcogenide material. The operations of 920 may be performed according to the methods described herein. In certain examples, aspects of the operations of 920 may be performed by one or more processes described with reference to FIGS. 4A through 4H.

At 925 a fourth conductive material may be deposited. The operations of 925 may be performed according to the methods described herein. In certain examples, aspects of the operations of 925 may be performed by one or more processes described with reference to FIGS. 4A through 4H.

At 930 a removal of material in a second direction may occur, to form a plurality of pillars in the second conductive material, the first chalcogenide material, the second chalcogenide material, and the third conductive material, and the fourth conductive material. In some examples, the storage component may be formed based at least in part on removing the material to form the plurality of lines and removing the material to form the plurality of pillars. The operations of 930 may be performed according to the methods described herein. In certain examples, aspects of the operations of 930 may be performed by one or more processes described with reference to FIGS. 4A through 4H.

At 935 at least a portion of the third chalcogenide material may be removed in the second direction. In some examples, forming the storage component may be based at least in part on removing at least a portion of the third chalcogenide material in the first direction and the second direction. The operations of 935 may be performed according to the methods described herein. In certain examples, aspects of the operations of 935 may be performed by one or more processes described with reference to FIGS. 4A through 4H.

In some cases, the method may include forming a stack that includes a first conductive material, a second conductive material, a third conductive material, and a first chalcogenide material and a second chalcogenide material between the second conductive material and the third conductive material. The method may also include removing material in a first direction to form a plurality of lines in the first conductive material, the second conductive material, the first chalcogenide material, the second chalcogenide material, and the third conductive material. In some examples, the method may include removing at least a portion of the third chalcogenide material in the first direction.

In some examples, the method may include depositing a liner in contact with at least one side of the third conductive material, the second chalcogenide material, and the first chalcogenide material. The method may also include depositing a fourth conductive material and, in some cases, may include removing material in a second direction to form a plurality of pillars in the second conductive material, the first chalcogenide material, the second chalcogenide material, and the third conductive material, and the fourth conductive material. In some examples, the storage component may be formed based at least in part on removing the material to form the plurality of lines and removing the material to form the plurality of pillars.

In other cases, the method may include removing at least a portion of the third chalcogenide material in the second direction, and forming the storage component may be based at least in part on removing at least a portion of the third chalcogenide material in the first direction and the second direction. In some cases, each of the first chalcogenide material, the second chalcogenide material, and the third chalcogenide material of the storage component may include a different dimension in at least one direction.

It should be noted that the methods described above describe possible implementations, and that the operations and the steps may be rearranged or otherwise modified and that other implementations are possible. Furthermore, examples from two or more of the methods may be combined.

While some examples described herein relate to tapered profiles that may monotonically increase or decrease in a given direction, this is not required. For example, the desired profile/shape of a memory storage element may include an hourglass shape, a barrel shape, or any other non-monotonic shape.

In some cases, a barrel-like taper profile may be beneficial. For example, when a memory cell is programmed using a given polarity, anions may drift towards one surface (e.g., a top or bottom surface) of a memory storage element and cations may drift towards the opposite surface (e.g., a bottom or top surface) of the memory storage element. As compared with some symmetrically shaped memory cells, a memory storage element having a barrel-like taper profile, or another profile in which the widths of the top and bottom surfaces of the memory storage element are narrower than the width of a middle portion of the memory storage element, may cause an increase in the concentrations of the cations and/or anions at the respective surfaces by having narrow contact areas at each electrode and a larger, bulk ion reservoir at the middle of the memory storage element, for example.

Figure 10:
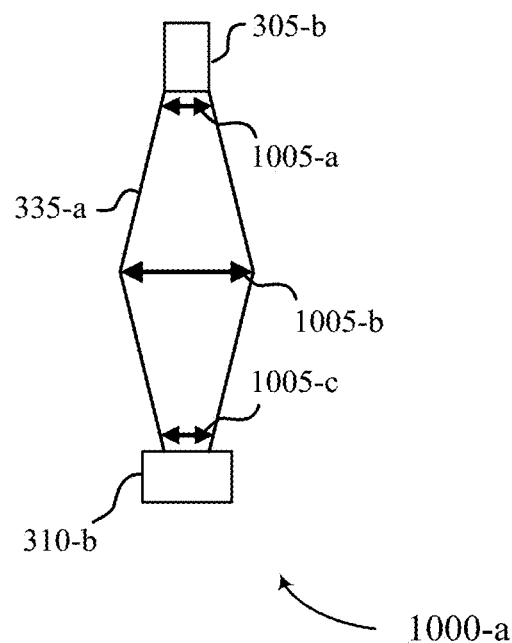
FIG. 10 illustrates example memory cells that support a tapered cell profile and fabrication in accordance with examples of the present disclosure.
Figure 10:
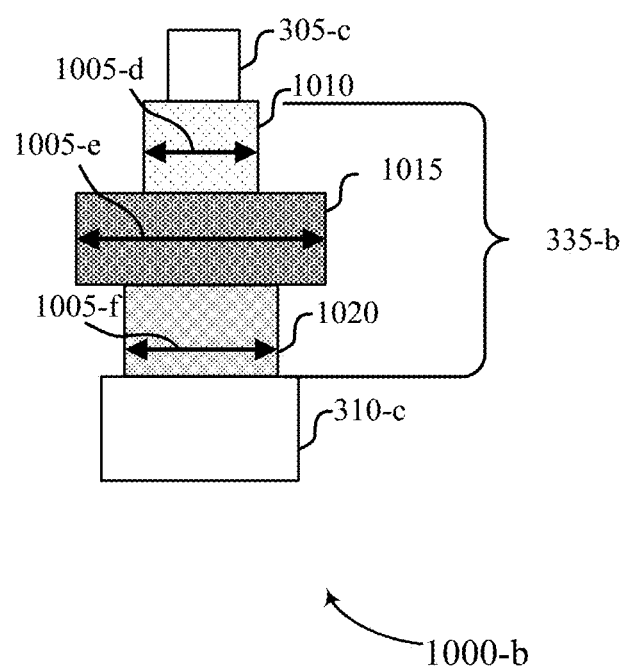

FIG. 10 illustrates example memory cells 1000-$a$, 1000-$b$ that may be formed in accordance with examples of the present disclosure. Memory cells 1000-$a$, 1000-$b$ provide examples of asymmetric geometries in which the widths of the top and bottom surfaces of the memory storage element are narrower than the width of a middle portion of the memory storage element. Memory cells 1000-$a$ and 1000-$b$ have memory storage element profiles that may result in anion crowding at one surface of the memory storage element and cation crowding at the opposite surface, or vice versa, depending on the polarity of the operation.

The memory storage element 335-$a$ of memory cell 1000-$a$ provides an example of a barrel-like taper profile, with a wider width 1005-$b$ near the middle of the memory storage element, and narrower widths 1005-$a$, 1005-$c$ near the surfaces of the memory storage element 335-$a$ that are coupled with electrodes 305-$b$, 310-$b$. In some cases, the width 1005-$a$ is similar to or the same as the width 1005-$c$. In some cases, the width 1005-$a$ is different than the width 1005-$c$. Memory storage element 335-$a$ may be coupled to access lines via electrodes 305-$b$, 310-$b$, for example.

The memory storage element 335-$b$ of memory cell 1000-$b$ provides an example of a stepped memory storage element with a stepped profile having a first (middle) portion 1015 with a wider width 1005-$e$ relative to second and third portions 1010, 1020 that have narrower widths 1005-$d$, 1005-$f$ near the top and bottom surfaces of memory storage element 335-$b$. In this example, the second and third portions 1010, 1020 have different widths 1005-$d$, 1005-$f$. In other examples, the second and third portions may have the same width. Memory storage element 335-$b$ may be coupled to access lines via electrodes 305-$c$, 310-$c$, for example.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
a storage component comprising a chalcogenide material, the storage component having a first surface and a second surface opposite the first surface, the second surface having a greater area than the first surface, the storage component having a stepped taper profile between the first surface and the second surface;
a first electrode coupled with the first surface of the storage component;
a second electrode coupled with the second surface of the storage component and coupled with the first electrode via the storage component; and
a third electrode abutting the second electrode.

2. The memory device of claim 1, further comprising:
a first conductive material coupled with the first electrode.

3. The memory device of claim 2, wherein a width of the first conductive material is the same as a width of the first electrode in a first direction.

4. The memory device of claim 1, wherein a first portion of the storage component is a first width in a first direction and a second portion of the storage component is a second width in the first direction, the first width being different than the second width to form the stepped taper profile of the storage component.

5. The memory device of claim 4, wherein the first width is the same as a width of the first electrode in the first direction and the second width is the same as a width of the second electrode in the first direction.

6. The memory device of claim 1, wherein a width of a center portion of the storage component is different from a width of the first electrode and a width of the second electrode in a first direction.

7. The memory device of claim 6, wherein the width of the center portion of the storage component is greater than the width of the first electrode and the width of the second electrode in the first direction.

8. The memory device of claim 1, wherein the chalcogenide material comprises a mixture of a first chalcogenide material and a second chalcogenide material different from the first chalcogenide material.

9. The memory device of claim 1, further comprising:
a first chalcogenide material, a second chalcogenide material different from the first chalcogenide material, and a third chalcogenide material, wherein the storage component comprises a mixture of the first chalcogenide material, the second chalcogenide material, and the third chalcogenide material.

10. The memory device of claim 1, further comprising:
a dielectric material in contact with at least one side of each of the storage component, the first electrode, and the second electrode; and
a liner in contact with at least one side of the storage component.

11. The memory device of claim 1, further comprising:
a second deck coupled with a first deck that comprises the storage component, the second deck comprising:
a second storage component comprising a second chalcogenide material.

12. A memory device, comprising:
a storage component comprising a first chalcogenide material and a second chalcogenide material, the storage component having a first surface and a second surface opposite the first surface in a first direction, the second surface having a greater area than the first surface, the storage component having a stepped taper profile between the first surface and the second surface;
a first electrode coupled with the first surface of the storage component;
a second electrode coupled with the second surface of the storage component and coupled with the first electrode via the storage component; and
a third electrode abutting the second electrode.

13. The memory device of claim 12, further comprising:
a first conductive material coupled with the first electrode.

14. The memory device of claim 12, wherein the second chalcogenide material is different from the first chalcogenide material.

15. The memory device of claim 12, wherein a width of the first chalcogenide material is the same as a width of the first electrode, and wherein a width of the second chalcogenide material is the same as a width of the second electrode, and wherein the width of the first chalcogenide material is different than the width of the second chalcogenide material to form the stepped taper profile of the storage component.

16. The memory device of claim 12, wherein the first chalcogenide material further comprises a third chalcogenide material different from the first chalcogenide material and the second chalcogenide material, the third chalcogenide material in contact with at least one side of the second chalcogenide material.

17. The memory device of claim 16, wherein the second chalcogenide material comprises a different dimension than the third chalcogenide material and the first chalcogenide material comprises a different dimension from the second chalcogenide material and the third chalcogenide material in at least one direction.

18. A memory device, comprising:
an array of memory cells, a memory cell of the array comprising:
a storage component comprising a chalcogenide material, the storage component configured to store a logic state of the memory cell of the array of memory cells, wherein a first portion of the storage component is a first width in a first direction and a second portion of the storage component is a second width in the first direction, the storage component having a stepped taper profile between the first portion and the second portion;
a first electrode coupled with a first surface of the storage component, wherein a width of the first electrode is the same as the first width;
a second electrode coupled with a second surface opposite the first surface of the storage component, wherein a width of the second electrode is the same as the second width; and
a controller coupled with the array of memory cells and configured to:
apply a voltage across the storage component, wherein one or more ions migrate within the storage component based at least in part on applying the voltage; and
determine the logic state of the memory cell based at least in part on a first density of ions in the storage component relative to the first electrode and a second density of ions in the storage component relative to the second electrode, wherein the first density of ions is based at least in part on the first width and the second density of ions is based at least in part on the second width.

19. The memory device of claim 18, wherein the controller is further configured to:

determine whether the first density of ions and the second density of ions correspond to a first threshold voltage of the memory cell or a second threshold voltage of the memory cell; and determine the logic state of the memory cell based at least in part on the first threshold voltage or the second threshold voltage.

20. The memory device of claim 19, wherein a difference between the first threshold voltage and the second threshold voltage is based at least in part on the first width of the storage component being different from the second width of the storage component.

* * * * *